(12) United States Patent
Emoto et al.

(10) Patent No.: US 8,125,139 B2
(45) Date of Patent: Feb. 28, 2012

(54) FLUORESCENT SUBSTANCE AND PROCESS FOR PRODUCING THE SAME, AND LUMINESCENT ELEMENT USING THE SAME

(75) Inventors: Hideyuki Emoto, Machida (JP); Masahiro Ibukiyama, Machida (JP); Kenji Nomura, Machida (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 471 days.

(21) Appl. No.: 11/817,261

(22) PCT Filed: Feb. 28, 2006

(86) PCT No.: PCT/JP2006/303730
§ 371 (c)(1),
(2), (4) Date: Aug. 28, 2007

(87) PCT Pub. No.: WO2006/093135
PCT Pub. Date: Sep. 8, 2006

(65) Prior Publication Data
US 2009/0021141 A1    Jan. 22, 2009

(30) Foreign Application Priority Data

| Feb. 28, 2005 | (JP) | 2005-052270 |
| Apr. 15, 2005 | (JP) | 2005-118271 |
| May 19, 2005 | (JP) | 2005-146917 |
| Oct. 19, 2005 | (JP) | 2005-304268 |

(51) Int. Cl.
*C09K 11/00* (2006.01)
*C09K 11/59* (2006.01)

(52) U.S. Cl. .................. 313/503; 252/301.4 R
(58) Field of Classification Search ................. 313/503; 252/301.4 R
See application file for complete search history.

(56) References Cited

U.S. PATENT DOCUMENTS

| 6,657,379 | B2 | 12/2003 | Ellens et al. |
| 2003/0030368 | A1* | 2/2003 | Ellens et al. .................. 313/503 |
| 2004/0135504 | A1 | 7/2004 | Tamaki et al. |
| 2004/0155225 | A1* | 8/2004 | Yamada et al. ........ 252/301.4 R |
| 2005/0012075 | A1 | 1/2005 | Sakata et al. |
| 2006/0001352 | A1* | 1/2006 | Maruta et al. ................. 313/486 |

FOREIGN PATENT DOCUMENTS

JP    11 214752    8/1999
(Continued)

OTHER PUBLICATIONS

J.W.T. van Rutten at al. "Carbothermal Preparation and Characterisation of Ca-α-sialon", J. Eur. Ceram. Soc., 15 (1995), 599-604.*

(Continued)

*Primary Examiner* — Joseph L Williams
*Assistant Examiner* — Nathaniel Lee
(74) *Attorney, Agent, or Firm* — Oblon, Spivak, McClelland, Maier & Neustadt, L.L.P.

(57) ABSTRACT

Provided is a phosphor material for a white LED with a blue LED or ultraviolet LED as a light source.
A phosphor comprises an α-sialon represented by the formula: $(M1)_x(M2)_y(Si)_{12-(m+n)}(Al)_{m+n}(O)_n(N)_{16-n}$ where M1 is at least one element selected from the group consisting of Li, Mg, Ca, Y and lanthanide metals (except for La and Ce), M2 is at least one element selected from Ce, Pr, Eu, Tb, Yb and Er, $0.3 \leq X+Y \leq 1.5$, $0 < Y \leq 0.7$, $0.6 \leq m \leq 3.0$, $0 \leq n \leq 1.5$ and $X+Y=m/2$; and the oxygen content in a powder of the α-sialon is at most 0.4 mass % larger than a value calculated based on the formula.

25 Claims, 2 Drawing Sheets

FOREIGN PATENT DOCUMENTS

| | | |
|---|---|---|
| JP | 2000-204368 | 7/2000 |
| JP | 2001-303037 | 10/2001 |
| JP | 2002-249769 | 9/2002 |
| JP | 2002-363554 | 12/2002 |
| JP | 2003-124527 | 4/2003 |
| JP | 2003 124527 | 4/2003 |
| JP | 2003-206481 | 7/2003 |
| JP | 2003 321675 | 11/2003 |
| JP | 2003-336059 | 11/2003 |
| JP | 2004 67837 | 3/2004 |
| JP | 2004067837 | 3/2004 |
| JP | 2004 161807 | 6/2004 |
| JP | 2004 179644 | 6/2004 |
| JP | 2004-186278 | 7/2004 |
| JP | 2004 238505 | 8/2004 |
| JP | 2004238506 | 8/2004 |
| JP | 2004-244560 | 9/2004 |
| JP | 2004277265 A * | 10/2004 |
| JP | 2005 8794 | 1/2005 |
| JP | 2005 19663 | 1/2005 |
| JP | 2005 36038 | 2/2005 |
| JP | 2006-524425 | 10/2006 |
| KR | 10-20040002307 (A) | 1/2004 |
| KR | 10-20050016804 (A) | 2/2005 |
| KR | 10-0900282 | 5/2009 |
| WO | WO96/09353 | 3/1996 |
| WO | WO96/093534 | 3/1996 |
| WO | WO 2004042834 A1 * | 5/2004 |
| WO | WO 2004/097949 A1 | 11/2004 |
| WO | WO 2005/102921 A1 | 11/2005 |

OTHER PUBLICATIONS

J. W. H. van Krevel, "On new rare-earth doped M-Si-Al-O-N materials," TU Eindhoven, The Netherlands, 1998 pp. 145-161.

Extended Abstracts (The 65$^{th}$ Autumn Meeting, Sep. 2004, Tohoku Gakuin University) The Japan Society of Applied Physics, No. 3, pp. 1282-1284.

Extended Abstracts (The 52$^{nd}$ Spring Meeting, Mar. 2005, Saitama University) No. The Japan Society of Applied Physics and Related Societies, p. 1615.

M. Mitomo et al., "Preparation of α-SiAlON Powders by Carbothermal Reduction and Nitridation," Ceramics International, 14, 1988, pp. 43-48.

J.W. T van Rutten et al., "Carbothermal Preparation and Characterisation of Ca-α-SiAlON," J. Eur. Ceram. Soc., 15, 1995, pp. 599-604.

Komeya et al., "Hollow Beads Composed of Nanosize Ca α-SiAlON Grains," J. Am. Ceram Soc., vol. 83, No. 4, 2000, pp. 995-997.

J. W. H. van Krevel, "On new rare-earth doped M-Si-Ai-O-N. materials," Tu Eindhoven, The Netherlands, 1998 pp. 145-161.

Extended Abstracts (The 65$^{th}$ Autumn Meeting, Sep., 2004, Tohoku Gakuin University) The Japan Society of Applied Physics, no. 3, pp. 1282-1284.

Extended Abstracts (The 52$^{nd}$ Spring Meeting, Mar. 2005, Saitama University) No. The Japan Society of Applied Physics and Related Societies, p. 1615.

M. Mitomo et al., "Preparation of α-SiAlON Powders by Carbothermal Reduction and Nitridation," Ceramics International, 14, 1988, pp. 43-48.

J. W. T van Rutten et al., "Carbothermal Preparation and Characterisation of Ca-α-SiAlON," J. Eur. Ceram. Soc., 15, 1995, pp. 599-604.

Komeya et al., "Hollow Beads Composed of Nanosize Ca α-SiAlON Grains," J. Am. Ceram Soc., vol. 83, No. 4, 2000, pp. 995-997.

Korean Office Action issued: Aug. 26, 2011, application No. 2007-7017685, with English translation.

* cited by examiner

FLUORESCENT SUBSTANCE AND PROCESS FOR PRODUCING THE SAME, AND LUMINESCENT ELEMENT USING THE SAME

TECHNICAL FIELD

The present invention relates to an α-sialon phosphor excited by ultraviolet to blue light to emit visible light, a process for its production, and a light emitting device using it, particularly a white LED.

BACKGROUND ART

Phosphors widely known are those using a silicate, a phosphate, an aluminate or a sulfide as a matrix material and a transition metal or a rare earth metal as a luminescent center. On the other hand, with respect to a white LED, attention is drawing toward phosphors excited by an excitation source with high energy such as ultraviolet or blue light to emit visible light, and development thereof is under way. However, the above-mentioned conventional phosphors have a problem that the luminance thereof decreases as a result of exposure to the excitation source. Recently, nitride and oxynitride phosphors are drawing attention as phosphors with small decrease in luminance, because they are materials having a stable crystal structure and being capable of shifting the excitation light and luminescent light to the longer wavelength side.

Among the nitride and oxynitride phosphors, an α-sialon activated by a specific rare earth element is known as a material having a useful fluorescence property and its application to a white LED or the like is being studied (cf. Patent Documents 1 to 5 and Non-patent Document 1). In addition, it is found that $Ca_2(Si,Al)_5N_8$, $CaSiAlN_3$ and a β-sialon activated by a rare earth element also have the same fluorescence property (cf. Patent Document 6 and Non-patent Documents 2 and 3). Other phosphors proposed include phosphors of nitrides and oxynitrides, such as aluminum nitride, magnesium silicon nitride, calcium silicon nitride, barium silicon nitride, gallium nitride and zinc silicon nitride (which will also be referred to hereinafter as nitride phosphors and oxynitride phosphors in the order named).

The α-sialon is obtained by firing a powder mixture composed of silicon nitride, aluminum nitride, aluminum oxide, an oxide of an element penetrating into a crystal lattice to make a solid solution therewith, etc., at a high temperature in nitrogen. A variety of fluorescence properties can be obtained depending on a ratio of silicon nitride and the aluminum compounds, a kind of the element penetrating to make a solid solution, a ratio of the element becoming the luminescent center, and the like. The element penetrating to make a solid solution is Ca, Li, Mg, Y or a lanthanide metal (except for La and Ce) and the α-sialon takes such a structure in order to maintain electrical neutrality that Si—N bonds are partially substituted by Al—N bonds and Al—O bonds. When a part of the element penetrating to make a solid solution is the rare earth element as the luminescent center, the fluorescence property is exhibited.

Incidentally, it is still the case that the white LEDs obtained heretofore are inferior in luminous efficiency to fluorescent lamps, and there is a strong demand for a LED superior in luminous efficiency to the fluorescent lamps, particularly, a white LED from the viewpoint of energy conservation in industry.

A combination of plural colors is required to make white light, different from monochromatic light, and a general white LED is composed of a combination of an ultraviolet LED or a blue LED with a phosphor emitting visible light with the LED as an excitation source. Thus, in order to improve the efficiency of the white LED, it is necessary to improve not only the luminous efficiency of the LED itself, the ultraviolet LED or blue LED, but also the luminous efficiency of the phosphor used therein, and to improve an efficiency of extraction of emitted light to the outside. Improvements in all these efficiencies are necessary to broaden application of the white LED, including application for general illumination.

One of the known methods for synthesizing such phosphors, for example, in a case of α-sialon powder, is a reduction and nitridation method wherein a powder mixture of aluminum oxide ($Al_2O_3$), silicon oxide ($SiO_2$), an oxide of a metal or an element capable of making a solid solution in the lattice, and so on is subjected to a heat treatment in a nitrogen atmosphere in the presence of carbon (cf. Non-patent Documents 4 to 6).

This method has merits that raw-material powders are inexpensive and the synthesis can be carried out at a relatively low temperature around 1500° C. However, this method goes through plural intermediates on the way of the synthesis and generates gas components such as SiO and CO, and it is thus difficult to obtain a phosphor in a single phase, to severely control the composition, and to control particle sizes.

The α- or β-sialon powder can be obtained by firing a mixture of silicon nitride, aluminum nitride, an oxide of a metal or an element capable of making a solid solution in the lattice thereof, and so on at a high temperature and pulverizing the obtained sintered body. However, there was a problem that the luminescence intensity of the phosphor was decreased by the pulverizing operation of the sintered body as described below.

Furthermore, the phosphor for the white LED is generally used as dispersed in the form of micron-size particles in a sealant such as epoxy. The dispersion state and compatibility with the sealant, however, significantly affect the efficiency of extraction of LED light. Furthermore, surface coating of the phosphor is also being studied for improvement in the luminous efficiency of the phosphor and prevention of degradation, but its effect is different depending on the phosphors; there is a case not showing any effect at all and the effect was thus uncertain (Patent Documents 7 to 9).

The nitrides and oxynitrides have larger refractive indices and smaller specific gravities than the oxide phosphors such as YAG:Ce conventionally used for the white LEDs, and they failed to provide a satisfactory luminescence property as an LED when used in the same manner as the oxide phosphors.

Patent Document 1: JP-A-2002-363554
Patent Document 2: JP-A-2003-336059
Patent Document 3: JP-A-2003-124527
Patent Document 4: JP-A-2003-206481
Patent Document 5: JP-A-2004-186278
Patent Document 6: JP-A-2004-244560
Patent Document 7: JP-A-2001-303037
Patent Document 8: JP-A-2000-204368
Patent Document 9: International Publication WO96/09353 Pamphlet
Non-Patent Document 1: J. W. H. van Krebel, "On new rare-earth doped M-Si—Al—O—N materials," TU Eindhoven, The Netherlands, p. 145-161 (1998)
Non-Patent Document 2: Extended Abstracts (The 65th Autumn Meeting, September, 2004, Tohoku Gakuin University) No. 3, p. 1282-1284; The Japan Society of Applied Physics Non-Patent Document 3: Extended Abstracts (The 52nd Spring meeting, March, 2005, Saitama University) No. 3, p. 1615; The Japan Society of Applied Physics and Related Societies Non-Patent Document 4: M. Mitomo et al., "Preparation of α-SiAlON Powders by Carbothermal Reduction and Nitridation," Ceram. Int., 14, 43-48 (1988)

Non-Patent Document 5: J. W. T. van Rutten et al., "Carbothermal Preparation and Characterization of Ca-α-SiAlON," J. Eur. Ceram. Soc., 15, 599-604 (1995)

Non-Patent Document 6: K. Komeya et al., "Hollow Beads Composed of Nanosize Ca α-SiAlON Grains," J. Am. Ceram, Soc., 83, 995-997 (2000)

DISCLOSURE OF THE INVENTION

Objects to be Accomplished by the Invention

As described above, the conventional techniques had the problem that the powder of the nitride phosphor or oxynitride phosphor could not be obtained as a phosphor powder with a satisfactory property, by simply mixing and heating nitrides containing constituent elements and a compound containing an activating element or by simply reduction-nitriding a mixture of oxides of constituent elements in the presence of carbon or the like.

Particularly, in the conventionally known nitride or oxynitride production method of mixing and heating the nitrides containing constituent elements and the oxide containing an activating element, a pulverization treatment under severe conditions is required in order to obtain the powder with desired particle sizes because coalescences between particles become stronger by liquid-phase sintering during the firing step. As the pulverization conditions become severer, a chance of incorporation of impurities becomes larger and a defect is introduced into a surface of each particle. The phosphor is excited in the vicinity of its surface with excitation light to emit fluorescent light, and the surface defects introduced by the pulverization treatment significantly affect the fluorescence property and raised the problem of degradation of the luminescence property.

Furthermore, the nitride powder contains oxygen as an unavoidable impurity and there are two types of oxygen; oxygen existing in the form of a solid solution in the particles and oxygen existing in the form of oxide coating films on surfaces of the particles. Amounts of the oxygen existing in the particles (hereinafter referred to as "solid solution oxygen") and the oxygen existing on the surfaces (hereinafter referred to as "surface oxygen") differ depending on a production history of the nitride powder, storage conditions, a kind of the nitride, and so on, which causes variation in the luminescence property of the phosphors synthesized with use of nitride raw materials.

The nitrides and oxynitrides have larger refractive indices and smaller specific gravities than the oxide phosphors such as YAG:Ce conventionally used for the white LEDs, and failed to provide a satisfactory luminescence property as an LED when used in the same manner as the oxide phosphors.

In the conventional technologies, the luminous efficiency of the α-sialon phosphor has been improved with attention mainly to the composition of the solid solution such as the substitutional amount of Al—N and Al—O bonds into the α-silicon nitride forming a framework of the crystal and a kind, an amount and a ratio of the element penetrating into the crystal lattice to make the solid solution, and the factors other than the composition have not been studied much.

Moreover, the α-sialon sintered body obtained by firing at a high temperature is pulverized to obtain the α-sialon powder, and there was a problem that the luminescence intensity of the phosphor was decreased due to impurities adhering to the α-sialon powder, depending on the pulverizing operation.

A phosphor for a white LED is generally used as dispersed in the form of micron-size particles in a sealant such as an epoxy resin. It is necessary to determine the particle sizes in terms of dispersibility into the resin and variation in coloring. The α-sialon phosphor is composed of secondary particles resulting from sintering of plural fine primary particles. In general, particle size information obtained by measurement of a particle size distribution is that about the secondary particles, and there were studies on the secondary particles in application to the phosphor. However, no attention has been paid to the primary particles.

The present invention has been accomplished to solve the above problems and an object of the present invention is to provide a sialon phosphor excellent in the luminous efficiency and a light emitting device using it, particularly a white LED excellent in the luminous efficiency with a blue LED or ultraviolet LED as a light source.

Means to Accomplish the Object

The present inventors conducted various experimental studies on the nitride phosphors and oxynitride phosphors, and found that the fluorescence property of the phosphor is largely affected, particularly, by properly combining various factors such as an amount of oxygen in the phosphor, a condition of surfaces of the phosphor particles, surface coating, and a sealant resin, thereby achieving the present invention.

The present invention has been accomplished based particularly on the finding as a result of various studies on α-sialons that an α-sialon with a specific structure has a peak at a wavelength in the range of from 550 to 600 nm, is excellent in the luminous efficiency, and is suitably applicable to an LED, particularly a white LED excellent in the luminous efficiency with a blue light LED or ultraviolet LED as a light source.

Namely, the present invention provides a powdery phosphor comprising an α-sialon represented by the formula: $(M1)_X(M2)_Y(Si)_{12-(m+n)}(Al)_{m+n}(O)_n(N)_{16-n}$ where M1 is at least one element selected from the group consisting of Li, Mg, Ca, Y and lanthanide metals (except for La and Ce), M2 is at least one element selected from Ce, Pr, Eu, Tb, Yb and Er, $0.3 \leq X+Y \leq 1.5$, $0 < Y \leq 0.7$, $0.6 \leq m \leq 3.0$, $0 \leq n \leq 1.5$, and $X+Y=m/2$, wherein the oxygen content in a powder of the α-sialon is larger than a value calculated based on the formula, in a range of less than 0.4 mass % of said value.

The present invention is characterized by a phosphor which is a powdery phosphor comprising particles of a metal nitride or oxynitride, wherein a transparent film is formed on at least a part of a surface of each particle of the metal nitride or oxynitride and in a thickness of (10 to 180)/n (unit: nanometer). Here, n is a refractive index of the transparent film and is from 1.2 to 2.5. In a preferred embodiment of the present invention, n is from 1.5 to 2.0. The transparent film is preferably formed in the same manner on at least a part of the surface of the sialon particle as well.

The present invention provides a phosphor represented by the formula of $(M1)_X(M2)_Y(Si,Al)_{12}(O,N)_{16}$ as the above formula, where $0.3 \leq X+Y \leq 1.5$ and $0 < Y \leq 0.7$, wherein primary particles constituting a powder of the α-sialon have an average aspect ratio of at most 3, and wherein at least 80% (percentage by particle number) of the primary particles have a diameter of from 3 to 10 μm.

Furthermore, the present invention provides a phosphor, wherein the above formula is $(Ca,Eu)_{m/2}(Si)_{12-(m+n)}(Al)_{m+n}(O)_n(N)_{16-n}$, an Eu content is from 0.1 to 0.35 at %, lattice constant a is from 0.780 to 0.790 nm and lattice constant c is from 0.560 to 0.580 nm.

In each of the above-mentioned phosphors, it is preferred that M1 contains at least Ca and M2 contains at least Eu; and it is more preferred that the above M1 is Ca and the above M2 is Eu.

The above-mentioned phosphor is preferably a phosphor in which M1 contains at least Ca, M2 contains at least Eu, and $0.01<Y/(X+Y)<0.3$; and which has a luminescence property with a peak in a wavelength range of from 550 to 600 nm when irradiated with ultraviolet or visible light having a maximum intensity of emission wavelengths in a range of from 100 to 500 nm.

Furthermore, in the above-mentioned phosphor comprising a powder of the α-sialon, it is preferred that an average particle size of powder particles of the α-sialon is from 1 to 20 μm, and it is more preferred that a content of an impurity other than the elements constituting the α-sialon is at most 1 mass %.

In addition, the present invention provides a light emitting device comprising, as constituent elements, the above-mentioned phosphor and an LED with a maximum intensity of emission wavelength in a range of from 240 to 480 nm. This light emitting device is preferably one in which the LED and the nitride or oxynitride phosphor are implanted in the same resin layer with a refractive index of from 1.58 to 1.85 and in which a surface of the resin layer is covered with a resin with a refractive index of from 1.3 to 1.58.

The present invention provides an illumination instrument comprising a luminescent light source and a phosphor, in which the phosphor used is at least one of the above-mentioned phosphors. The above phosphor to be used is preferably selected from a phosphor in which M1 contains at least Ca, M2 contains at least Eu, and $0.01<Y/(X+Y)<0.3$; and which has a luminescence property with a peak in a wavelength range of from 550 to 600 nm when irradiated with ultraviolet or visible light of wavelengths of from 100 to 500 nm as an excitation source, and a phosphor which has a luminescence property with a peak in a wavelength range of from 500 to 550 nm when irradiated with ultraviolet or visible light of wavelengths of from 100 to 500 nm as an excitation source.

Furthermore, the present invention provides an illumination instrument comprising a luminescent light source and a phosphor, wherein the above phosphor used is a phosphor comprising an α-sialon represented by the formula: $(Ca,Eu)_{m/2}(Si)_{12-(m+n)}(Al)_{m+n}(O)_n(N)_{16-n}$, having an Eu content of from 0.1 to 0.35 at %, lattice constant a of from 0.780 to 0.790 nm and lattice constant c of from 0.560 to 0.580 nm, and in this illumination instrument the phosphor is preferably irradiated with ultraviolet or visible light as an excitation source.

The present invention provides a process for producing a phosphor comprising an α-sialon represented by the formula: $(M1)_X(M2)_Y(Si)_{12-(m+n)}(Al)_{m+n}(O)_n(N)_{16-n}$, where M1 is at least one element selected from the group consisting of Li, Mg, Ca, Y and lanthanide metals (except for La and Ce), M2 is at least one element selected from Ce, Pr, Eu, Tb, Yb and Er, $0.3\leq X+Y\leq 1.5$, $0<Y\leq 0.7$, $0.6\leq m\leq 3.0$, $0\leq n\leq 1.5$, and $X+Y=m/2$, wherein a calcium compound containing no oxygen is used as a raw material for Ca.

The present invention provides a process for producing a phosphor comprising an α-sialon represented by the formula: $(M1)_X(M2)_Y(Si)_{12-(m+n)}(Al)_{m+n}(O)_n(N)_{16-n}$, where M1 is at least one element selected from the group consisting of Li, Mg, Ca, Y and lanthanide metals (except for La and Ce), M2 is at least one element selected from Ce, Pr, Eu, Tb, Yb and Er, $0.3\leq X+Y\leq 1.5$, $0<Y\leq 0.7$, $0.6\leq m\leq 3.0$, $0\leq n\leq 1.5$, and $X+Y=m/2$, wherein a calcium compound containing oxygen is used in combination with the calcium compound containing no oxygen, as the raw material for Ca; preferably, the calcium compound containing no oxygen is used at a molar ratio of at least 0.5 times that of the calcium compound containing oxygen; more preferably, a total oxygen content in all raw materials is at most 4 mass %.

Furthermore, the present invention provides the phosphor production process further comprising performing an acid treatment of the phosphor, after production of the phosphor and the process is preferably a production process comprising suspending in an organic solvent a powdery phosphor comprising an α-sialon represented by the formula: $Ca_XM2_Y(Si)_{12-(m+n)}(Al)_{m+n}(O)_n(N)_{16-n}$ where M2 is at least one element selected from Ce, Pr, Eu, Tb, Yb and Er, $0.3\leq X+Y\leq 1.5$, $0<Y\leq 0.7$, $0.6\leq m\leq 3.0$, $0\leq n\leq 1.5$ and $X+Y=m/2$, and dropwise adding an organic metal complex or a metal alkoxide in the dispersion to form a transparent film in a thickness of (10 to 180)/n (unit: nanometer) on at least a part of a surface of each particle of the α-sialon constituting the phosphor, or a production process comprising suspending the phosphor in water and dropwise adding an aqueous solution of a metal salt while keeping a pH constant to form a transparent film in a thickness of (10 to 180)/n (unit: nanometer) on at least a part of a surface of each particle of the α-sialon constituting the phosphor. Here, n is a refractive index of the transparent film and is from 1.2 to 2.5.

Effects of the Invention

The preferred phosphor of the present invention comprises a nitride or oxynitride or an α-sialon of the specific composition in which the oxygen content is specified, or the phosphor has a structure in which a transparent material with the predetermined refractive index is formed in the predetermined thickness on at least a part of a surface of each of the particles constituting the phosphor, whereby the present invention achieves the effect that the phosphor of the present invention has a superior fluorescence property to the conventional phosphors, particularly, a superior luminescence property in the range of from 400 to 700 nm. Accordingly, the phosphor can be suitably applied to various LEDs, and in particular, an excellent white LED can be obtained in combination with an LED having the maximum intensity of luminescence wavelengths in the range of from 240 to 480 nm.

The α-sialon of the specific structure according to the present invention is efficiently excited by ultraviolet or visible light of wavelengths of from 100 to 500 nm, particularly, by visible light of wavelengths of from 440 to 480 nm to emit light with a peak in the range of from 550 to 600 nm, and therefore it is suitable for various illumination instruments and, particularly, for a white LED using a blue LED or an ultraviolet LED as a light source, while achieving a high energy efficiency by virtue of the excellent luminescence property.

Since the illumination instrument of the present invention uses the phosphor comprising the above α-sialon, it undergoes less change in luminance even in use at high temperatures and can achieve a longer lifetime; particularly, when the luminescent light source use is a blue LED which can emit visible light of from 440 to 480 nm, white light can be readily obtained by a combination of the light from the luminescent light source with the luminescence from the α-sialon, and thus it is applicable to various applications.

According to the process for producing the phosphor of the present invention, the phosphor having the above-mentioned features can be produced stably and in large quantity.

EXPLANATION OF REFERENCE NUMERALS

Figure 1:
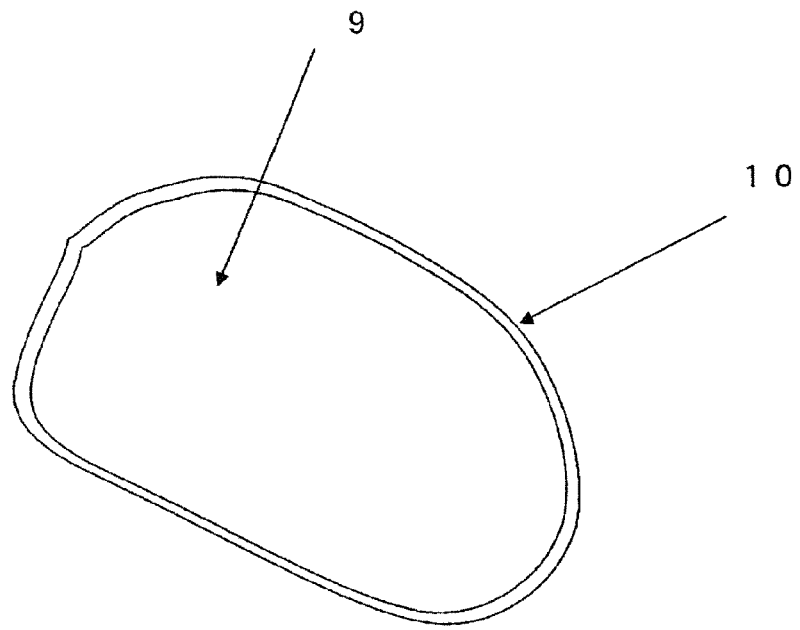
FIG. 1 is a cross-sectional view showing an example of the phosphor of the present invention.

1: sealant containing a phosphor
2: semiconductor device part
3: lead frame
4: wire
5: shell-type transparent resin
6: phosphor
7: resin layer
8: sealant resin
9: nitride or oxynitride phosphor
10: transparent film
11: blue LED chip
12: α-sialon phosphor
13: lead frame
14: sealant resin
15: container
16, 17: electrically conductive terminals

BEST MODE FOR CARRYING OUT THE INVENTION

The present inventors conducted various experimental studies on the nitride phosphors and oxynitride phosphors and accomplished the present invention to secure an excellent fluorescence property by (1) using an α-sialon of a specific composition and limiting its oxygen content to a specific value; (2) adopting a structure in which a transparent material with a predetermined refractive index is formed in a predetermined thickness on at least a part of a surface of the nitride phosphor or oxynitride phosphor; (3) specifying a composition of an α-sialon and a size and shape of its primary particles; or (4) specifying a composition and a crystal structure of an α-sialon.

First, the above (1) will be explained in detail. It is noted that the percentage means mass % unless otherwise noted.

The preferred phosphor of the present invention comprises an α-sialon of a specific composition. Namely, it is known that the α-sialon is represented by the formula: $(M1)_X(M2)_Y(Si)_{12-(m+n)}(Al)_{m+n}(O)_n(N)_{16-n}$ where M1 is at least one element selected from the group consisting of Li, Mg, Ca, Y and lanthanide metals (except for La and Ce), M2 is at least one element selected from Ce, Pr, Eu, Tb, Yb and Er, but the α-sialon selected in the present invention is one having relations of $0.3 \leq X+Y \leq 1.5$, $0 < Y \leq 0.7$, $0.6 \leq m \leq 3.0$, $0 \leq n \leq 1.5$ and $X+Y=m/2$. The α-sialon of this composition is important for obtaining a phosphor excellent in a fluorescence property.

Ca is preferably selected as M1 in the above-mentioned composition because it is inexpensive and achieves a stable fluorescence property. Furthermore, in this case, Eu is selected as M2 because of its excellent fluorescence property. With respect to X+Y, the lower limit of Y is preferably at least 0.01, more preferably at least 0.02, and the upper limit of Y is preferably at most 0.5, more preferably at most 0.3. If Y exceeds the upper limit (0.5) relative to X+Y, it will lead to occurrence of so-called concentration quenching to decrease the luminescence intensity of the phosphor, and increase in cost because Eu is expensive. On the other hand, if Y is less than 0.01 relative to X+Y, it will lead to decrease in the number of luminescent centers and reduction in the luminance.

In the present invention, the phosphor has a configuration wherein an amount of oxygen contained in the α-sialon powder of the above-mentioned specific composition is larger than a value calculated based on the above formula, in a range of less than 0.4 mass %, preferably 0.25 mass %, more preferably 0.15 mass %, and this configuration achieves the effect that the fluorescence property thereof is superior to those of the conventional phosphors. As a result, with respect to the amount of oxygen contained in the above α-sialon powder, the lower limit thereof is preferably at least 0.8 mass %, more preferably at least 1.0 mass % and the upper limit thereof is preferably at most 2.5 mass %, more preferably at most 2.0 mass %.

The reason is not clearly understood, but when the above configuration is adopted, it is possible to obtain the nitride or oxynitride phosphor with minimum sintering between particles, and also to obtain an effect that fine particles can be readily produced by pulverization in a level of crushing. This effect then provides such a characteristic that the phosphor has a suitable grain size. It is presumed that surface defects formed during the pulverization treatment are reduced in this phosphor by the above-mentioned characteristic, thereby enhancing the aforementioned feature of excellent luminescence property.

Then, (2) will be described in detail.

The present invention is based on the finding that the fluorescence property of the phosphor is improved by providing it with the structure in which the specific transparent film in the predetermined thickness is formed on at least a part of the surface of each of particles constituting the nitride or oxynitride phosphor, i.e., based on the finding that the fluorescence property of the phosphor can be enhanced by forming the transparent film of the predetermined material in the predetermined thickness on the surface of each particle.

The present inventors conducted studies on the transparent film formed on the surface of each particle, and found the following tendencies: there is an appropriate thickness range for the transparent film; if the film is thinner than a certain thickness, it becomes difficult to form the transparent film with high uniformity and it will result in weakening the effects such as the reduction in defects in surfaces of the phosphor particles and the prevention of reflection of light to excite the phosphor (referred to simply as "excitation light"), on the surfaces of the particles; on the other hand, if the film is too thick, the film itself will absorb light to decrease the luminous efficiency of the phosphor. In addition, in order to obtain an excellent fluorescence property with high repeatability, it is insufficient to simply determine the thickness and it is preferred to determine the thickness, also taking the refractive index of the transparent film into consideration.

Namely, in the present invention, the phosphor is a powdery phosphor comprising particles of a metal nitride or oxynitride, which has a structure in which a transparent film with a refractive index n (1.2 to 2.5) is formed on at least a part of a surface of each constituent particle thereof and in a thickness of (10 to 180)/n (unit: nanometer, n: the refractive index of the transparent film). By adopting this structure, reflection or absorption of light is prevented on the defects in surfaces of the phosphor particles and an absorptance of the excitation light is increased in the phosphor, thereby stably providing the high-efficiency phosphor. If it is outside the above numeral range, the appropriate thickness range is not always attained for the thickness of the transparent film, such being undesirable. In the particle with the transparent film of the present invention, the transparent film is preferably and ideally formed over the entire surface of the particle. This structure is observed with a scanning electron microscope, as illustrated in FIG. 1. In this example, the entire surface of the nitride or oxynitride phosphor 9 is covered with the transparent film 10. It is, however, noted that the effect of the present invention is achieved as long as a part of the particle surface, about a half or more of the particle surface, is covered.

The material making the above transparent film may be any transparent material with the refractive index n of from 1.2 to 2.5 (particularly preferably, one having transparency with a transmission coefficient of at least 80% in a region of ultraviolet to blue light, particularly, from 240 to 480 nm, depending on applications). Specific examples of such materials include inorganic substances such as silica, titania, alumina, magnesia and magnesium fluoride, and resins such as polystyrene, polycarbonate and polymethylstyrene. Among them, it is preferable to select one of the inorganic materials, in order to bring about the effect of reducing the defects in the surface of the phosphor.

Furthermore, when the phosphor is used for an LED and the like, there are many examples of use in which the phosphor is implanted into a resin, and in this case, a layer of the above transparent film lies between the resin and the surface of the phosphor. In this case, the refractive index of the transparent film is optically desired to have a value between the refractive indices of the above resin and the particles constituting the phosphor. For example, the refractive index of silicon nitride is 2.0 and an epoxy resin widely used as a sealant resin in the LED and a silicone resin under study for the ultraviolet LED both have the refractive indices around 1.5. There is no disclosure of data available with respect to the refractive indices of the nitride or oxynitride phosphors, but it was experimentally confirmed that their refractive indices were relatively large. If a difference between the refractive indices of the phosphor and the sealant resin is large, it will cause the excitation light having passed through the sealant resin and arrived at the surface of the phosphor, to be reflected on the surface. Thus, the formation of the film with the appropriate refractive index on the surface of the phosphor is useful to decrease in reflectance, i.e., to improvement in the fluorescent efficiency of the phosphor. Accordingly, the refractive index of the transparent film is preferably in a range of from 1.5 to 2.0, more preferably from 1.6 to 1.9. Specific examples of such materials include magnesia and alumina.

With respect to the quality of the material and the thickness of the transparent film, it is desirable to appropriately determine them according to the material of the transparent film and usage. Specific examples are as follows. Namely, magnesia has the refractive index of around 1.75 and the thickness of the film is preferably set to from 5 to 100 nm; in use of the phosphor for the ultraviolet excitation-type white LED, the thickness of the transparent film is set to from 5 to 70 nm, preferably from 10 to 60 nm; in use of the phosphor for the blue excitation-type white LED, the thickness of the transparent film is set to from 10 to 100 nm, preferably from 15 to 80 nm.

A main component of the blue or ultraviolet emitting device is gallium nitride and it is known that its refractive index is extremely large, about 2.4 to 2.5. In this case, it is desirable to cover the light emitting device with a resin having a high refractive index, in order to efficiently extract light from the light emitting device. In addition, a resin covering the phosphor (a resin in which the phosphor is implanted) is usually the same as the resin covering the light emitting device. For this application, it is preferred to use a resin with a high refractive index such as a polycarbonate resin, a fluorene epoxy resin, a fluorene silicone resin, a phenylsilane silicone resin and a sulfur-based epoxy resin. In addition, it is preferred to cover the outside of the resin with a resin having a low refractive index, in order to increase the efficiency of extracting light to the outside of the light emitting device. Examples of such resins include an epoxy resin, a silicone resin, a fluorine resin, a fluorine epoxy resin, and so on.

Accordingly, in application of the nitride phosphor or oxynitride phosphor to a light emitting device, a light emitting device with a high luminous efficiency can be constructed when it has the following structure: the transparent film with the refractive index of from 1.6 to 1.9 such as alumina or magnesia is formed on the surface of the phosphor (constituent particles); it is mixed with a resin having the refractive index of 1.58 to 1.85, i.e., a resin having a relatively high refractive index such as a fluorene epoxy resin; a semiconductor device (light emitting diode) is sealed with the mixture; the periphery of the sealant material is further surrounded by a resin having the refractive index of 1.3 to 1.58, e.g., a resin having a relatively low refractive index such as a fluorine epoxy resin.

The present invention is directed to an LED including, as constituent elements, the above phosphor and an LED element with the maximum intensity of luminescence wavelengths in the range of from 240 to 480 nm. The LED shows an excellent luminous efficiency while reflecting the excellent fluorescence property of the phosphor as described above. Furthermore, among the above phosphors, the phosphor in which the transparent film is formed on at least a part of a surface of each phosphor constituent particle is preferred because it shows a higher luminous efficiency; and the phosphor in which the transparent film layer has the refractive index of from 1.6 to 1.9 is further preferred because it shows the intrinsic excellent fluorescence property of the phosphor even in application to the LED where the phosphor is implanted into a resin.

Then, with respect to the phosphor of (1), its production method will be described below in detail using an example where M1 is Ca.

An α-sialon is synthesized by using and heating a mixture of raw materials in which (a) silicon nitride, (b) at least either of aluminum nitride and aluminum oxide, (c) a compound containing M1 and (d) a compound containing M2 are appropriately mixed so as to have a predetermined composition. The present invention is characterized in that the raw materials containing oxygen as little as possible are used in order to satisfy the conditions that the oxygen content is $0 \leq n \leq 1.5$ and the oxygen content is larger than a value calculated based on the formula, in the range of less than 0.4 mass %, as described above.

Namely, one of the processes for producing a phosphor of the present invention is characterized by using (a) silicon nitride, (b) aluminum nitride, (c) a compound containing Ca and (d) a compound containing M2 as raw materials, and by using a calcium compound containing no oxygen, as the above (c) the compound containing Ca. In this case, specific examples of the calcium compound containing no oxygen include calcium chloride, calcium sulfide, calcium cyanamide and calcium carbide. By adopting this configuration, it is feasible to provide the phosphor with an excellent pulverized property and with an excellent fluorescence property on a stable basis.

In a preferred embodiment of the production process of a phosphor according to the present invention, (c) the compound containing Ca is a combination of a calcium compound containing no oxygen, with a calcium compound containing oxygen. In this case, the calcium compound containing no oxygen may be calcium chloride, calcium sulfide, calcium nitride, calcium cyanamide or calcium carbide as described above and the calcium compound containing oxygen may be, for example, calcium oxide, calcium hydroxide, calcium carbonate, calcium sulfate or calcium nitrate. By applying this configuration, it becomes possible to use a reactive raw material in the form of fine particles such as CaO or an inexpensive calcium compound, and thus to provide the phosphor at a reasonable price, and considerable industrial effects can be expected.

When the calcium compound containing no oxygen is used in combination with the calcium compound containing oxygen, the ratio of the former to the latter is preferably at least 0.5 time larger in terms of the molar ratio of Ca. This is because such a composition prevents degradation of the fluorescence property of the resulting phosphor due to increase of the oxygen amount with use of a raw material containing much oxygen.

With respect to the above mixture of raw materials, in order to satisfy the conditions that the oxygen content in the formula of the α-sialon is $0 \leq n \leq 1.5$ and the oxygen content is larger than a value calculated based on the formula, in the range of less than 0.4 mass %, the oxygen amount in the mixture is preferably small. According to the studies by the present inventors, if the oxygen amount in the mixture of raw materials is at most 4 mass %, the phosphor satisfying the above conditions can be surely obtained, such being preferred.

Furthermore, the phosphor (α-sialon) is preferably subjected further to an acid treatment in the present invention. According to the present inventors' studies, the oxygen content of the phosphor can be decreased by the acid treatment of the phosphor, and as a result, the fluorescence property can be improved. Addition of this operation realizes an effect that a phosphor further excellent in the fluorescence property can be stably obtained. An acid used in the acid treatment may be an ordinary acid, and is preferably an acid capable of removing an oxide of silicon, such as hydrofluoric acid, or a mixed acid such as hydrofluoric acid-nitric acid or hydrofluoric acid-hydrochloric acid.

The present inventors, however, experienced that the oxygen amount in the phosphor was sometimes lower than the value obtained by calculation in which analysis values of the metal components were applied to the formula. In this case, no excellent fluorescence property is obtained. Namely, it is believed that when the actual oxygen amount is lower than the oxygen amount obtained from the formula, a phase different from the α-sialon must exist even though no crystal phase other than the α-sialon is confirmed by X-ray diffraction, and it is the cause of the failure in achievement of a satisfactory fluorescence property.

Then, with respect to the phosphor of (2), its production method will be described below in detail.

With respect to a method for forming the transparent film on the surface of the phosphor, one of the conventionally known various methods such as a wet method, a CVD method, sputtering, a vapor deposition method and a spray-pyrolysis technique, can be used, and the wet method and the spray-pyrolysis technique are preferred among them because they are simple in apparatus and advantageous in cost. An example of the wet method will be explained below.

Namely, the process for producing a phosphor of the present invention is a process comprising suspending in an organic solvent such as an alcohol, a nitride or oxynitride phosphor, such as a phosphor comprising the α-sialon having the desired composition as described above; dropwise adding an organic metal complex or a metal alkoxide, and an alkaline solution in the suspension to form a film of a metal oxide or hydroxide on a surface of each particle of the phosphor; and, thereafter, if necessary, firing the particles in air or in an inert gas such as nitrogen gas to form a transparent film in a predetermined thickness on at least a part of a surface of each particle of the α-sialon constituting the phosphor. The thickness of the transparent film formed on the surface of the particle can be readily controlled by controlling the condition of the dropwise addition, so that the phosphor excellent in the fluorescence property can be stably obtained with high repeatability.

Another preferred embodiment of the wet method is a method comprising suspending the above phosphor constituent particles in water; and dropwise adding an aqueous solution of a metal salt with a pH being kept constant, to form a transparent film in a thickness of (10 to 180)/n (unit: nanometer) on at least a part of a surface of each particle of the α-sialon constituting the phosphor. n is a refractive index of the transparent film and is from 1.2 to 2.5. In this method, the phosphor constituent particles are suspended in an alkaline, acid or buffer solution with the controlled pH with use of a stirrer or ultrasonic dispersion machine, and the aqueous solution of the metal salt is dropwise added to form a film of an oxide or hydroxide of the metal on the surface of the phosphor, followed by filtration, washing and drying, and, if necessary, by a heat treatment in air or in an inert gas such as nitrogen gas.

Furthermore, in this embodiment, the particles are treated with a silane coupling agent, preferably, with an epoxy-type silane coupling agent after forming the transparent film, which improves adhesion between the phosphor and a resin in which the phosphor is implanted during production of an LED, which also improves the dispersibility of the phosphor in the above resin, and as a result, which improves properties of the LED.

Next, the phosphor of (3) will be described in detail.

The phosphor of the present example is characterized in that the above formula is $(M1)_x(M2)_y(Si,Al)_{12}(O,N)_{16}$, where $0.3 \leq X+Y \leq 1.5$ and $0 < Y \leq 0.7$, an average aspect ratio of the primary particles constituting the powder of the above α-sialon particle is at most 3, and diameters of at least 80% (percentage by particle number) of the above primary particles are from 3 to 10 μm. This phosphor will be explained below.

The α-sialon is a solid solution wherein some of Si—N bonds in an α-silicon nitride are substituted with Al—N bonds and Al—O bonds and a specific cation penetrates into the lattice in order to maintain electrical neutrality, and it is represented by the formula: $M_Z(Si,Al)_{12}(O,N)_{16}$. Here, M is an element that can penetrate into the lattice and, specifically, is at least one element selected from Li, Mg, Ca, Y and lanthanide metals (except for La and Ce). An amount of solved M, Z-value, is a value determined by a substitution rate of Si—N bonds with Al—N and Al—O bonds.

It is necessary to make a part of M from an element that can make the solid solution and can be luminescent centers, in order to exhibit the fluorescence property, and it is preferred to use at least one element selected from Ce, Pr, Eu, Tb, Yb and Er, in order to obtain a visible light emitting phosphor. When the element not contributing to luminescence is M1 and the element becoming the luminescent centers is M2 among the elements penetrating into the lattice to make the solid solution, the formula becomes $(M1)_X(M2)_Y(Si,Al)_{12}(O,N)_{16}$. Here, the formula preferably satisfies the ranges of $0.3 \leq X+Y \leq 1.5$ and $0 < Y \leq 0.7$, in order to obtain the single phase of the α-sialon and to develop the fluorescence property.

The α-sialon is usually obtained by heating a powder mixture comprising silicon nitride, aluminum nitride and a compound of an element penetrating to make a solid solution, at a high temperature in an nitrogen atmosphere to cause reaction, as described above. In the course of raising the temperature, substances migrate through a liquid phase composed of silicon nitride, aluminum nitride, oxides on their surfaces and the compound of the element for the solid solution, to form an α-sialon. Therefore, in the α-sialon after the synthesis, some primary particles are sintered to form secondary particles, and they further form agglomerates; therefore, they are subjected to pulverization or the like to obtain the α-sialon in the form of powder.

The phosphor of this example was obtained based on the finding that the sizes, distribution and shape of the primary particles are closely associated with the luminescence property, as a result of studies on the relation between the luminescence property and the particle form. Namely, the phosphor of the present invention is made to select the following conditions, in addition to the above-mentioned composition: with respect to the primary particles constituting the powdery phosphor, an average aspect ratio thereof is at most 3 and at least 80% thereof in terms of percentage by particle number have the diameter of from 3 to 10 µm. Preferably, the average aspect ratio is at most 2.5 and at least 85% in terms of percentage by particle number have the diameter of from 3 to 10 µm.

With respect to the aspect ratio of the primary particles, the anisotropy is preferably small, for example, from the viewpoint of dispersibility in the sealant resin for the LED, the luminescence intensity of the LED, and variation in color tone. However, the phosphor can be used without any practical problem as long as the average aspect ratio of the primary particles is at most 3. The average aspect ratio of the primary particles may be determined by measuring aspect ratios (long-axis diameter/short-axis diameter) of at least 500 primary particles with a scanning electron microscope (SEM) and calculating an arithmetic mean thereof.

A distribution of sizes of the primary particles is preferably sharp. If the size distribution of primary particles is wide, variation might occur in the luminescence intensity and in color tone in use of the phosphor. On the other hand, if the primary particles are too small, optical absorptance will decrease because scattering and sintering will strongly proceed between particles, so as to require an excessive pulverization treatment to obtain predetermined particle sizes of powder (secondary particles), which, in turn, will raise problems that the luminescence property is deteriorated due to production of defects in the surfaces of the particles and that handleability becomes poor. For the above reasons, the present invention is arranged to select the condition of the sizes of the primary particles that at least 80% in terms of percentage by particle number of the primary particles have the diameter of from 3 to 10 µm. Here, the percentage by particle number is determined by measuring circle-equivalent diameters of at least 500 primary particles with a scanning electron microscope (SEM) and calculating the percentage, as described below.

Furthermore, a relation between a trace-amount element and the luminescence property of the α-sialon phosphor in the present invention is carried out, and found the following fact: a better luminescence property is obtained as a preferred result when the phosphor contains fluorine in an amount of from 5 to 300 ppm, preferably from 20 to 270 ppm, or boron in an amount of from 10 to 3000 ppm, preferably from 200 to 1000 ppm. This phenomenon becomes outstanding with at least 5 ppm of fluorine or with at least 10 ppm of boron, but no improvement in the effect can be made with more than 300 ppm of the former or with more than 3000 ppm of the latter. It is a matter of course that the phosphor may contain both of fluorine and boron. Boron can be measured by ICP emission spectrometry and fluorine can be measured by ion chromatography analysis.

There are no particular limitations on a method of adding a trace amount of fluorine or boron, and a preferred method for fluorine is to use a fluoride as one or more of the raw materials and to volatilize excessive fluorine during the synthesis. On the other hand, a preferred method for boron is to use a hexagonal boron nitride crucible as a crucible to be filled with the powder mixture of raw materials during the synthesis and to utilize a boron-containing volatile substance produced in a trace amount from the crucible at a high temperature, as a technique for uniformly adding a trace amount of boron.

Furthermore, the fluorine content in the α-sialon can be controlled by volatilizing a part of the fluorine compound in the raw materials as a volatile fluorine-containing substance in a heat treatment described below, or by removing the remaining fluorine compound by a treatment with an acid such as hydrochloric acid or sulfuric acid after the heat treatment.

When Ca is selected for M1 and Eu is selected for M2 as the elements to make the solid solution in the crystal lattice of the α-sialon, the phosphor is irradiated with ultraviolet or visible light of wavelengths in the range of from 100 to 500 nm as the excitation source whereupon the phosphor emits light of yellow to orange with a peak in the wavelength range of from 550 to 600 nm. This phosphor is preferred since a white LED is obtained by mixing yellow light emitted from the phosphor, with the excitation light in use of a blue LED as the excitation source, thereby providing illumination instruments emitting white light, such as the white LED.

With respect to the elements making the solid solution in the crystal lattice of the α-sialon, an atomic weight ratio of Eu becoming the luminescent centers is preferably in the range of $0.01 < Y/(X+Y) < 0.3$. When $Y/(X+Y)$ exceeds 0.01, the number of luminescent centers is enough to prevent reduction in the luminance; when it is less than 0.3, the luminance would not decrease by concentration quenching due to interference between Eu ions in the solid solution.

Now, as a process for producing the phosphor of this example, we will illustrate a method of synthesizing an α-sialon in which Ca and Eu make a solid solution. However, the production process is not limited to this method.

The phosphor of this example uses powders of silicon nitride, aluminum nitride, a calcium-containing compound and europium oxide as raw materials. As a fluorine source among these raw materials, it is preferred to use calcium fluoride, because the fluoride has a relatively high boiling point. However, if calcium fluoride is used as the whole calcium source, it becomes difficult to obtain a single phase of the α-sialon. Therefore, it is preferred to mix a compound to become calcium oxide after heating, e.g., calcium carbonate.

An applicable method for mixing the above raw materials may be a method of dry mixing, and a method of wet mixing in an inert solvent that does not substantially react with each component of the raw-materials, followed by removal of the solvent. A mixing apparatus suitably used is a V-type mixer, a rocking mixer, a ball mill, a vibration mill, or the like.

Powders obtained by mixing in a desired composition (hereinafter referred to simply as "raw-material powders") are filled in a container such as a crucible at least a surface of which to be brought into contact with the raw-material powders is made of boron nitride, and heated in a temperature range of from 1600 to 1800° C. in a nitrogen atmosphere for a predetermined time to obtain an α-sialon. The reason why boron nitride is used as the material for the container, is not only that the reactivity with each of the raw-material components is extremely low, but also that a trace amount of a boron-containing volatile component evolved from the container has an effect to promote crystal growth of the primary particles of the α-sialon. It is noted that a mixture of the raw-material powders is preferably so filled in the container that the bulk is set as high as possible, from the viewpoint of suppression of sintering between particles during the heating. Specifically, a filling rate of the mixture of the raw-material powders in the synthesizing container is preferably at most 40 mass %.

When the temperature of the heat treatment is at least 1600° C., there remain not many non-reacted products, and insufficient growth of the primary particles can be avoided; on the other hand, when the temperature is at most 1800° C., sintering between particles is not so outstanding; therefore, such a temperature range is preferred.

As for the heating period of time in the heat treatment, a time range is so selected as to avoid the problems that there remain many non-reacted products and that growth of the primary particles is insufficient, or the problem that sintering between particles occurs. The preferred range of the heating period is from 2 to 24 hours approximately.

The α-sialon obtained by the above process is an agglomerate, which is powdered into a predetermined size by a combination of crushing, pulverizing, and, if necessary, a classifying treatment, to obtain a powdery phosphor applicable for various applications.

For preferable use as a phosphor for an LED, an average particle size of the secondary particles made by sintering of plural primary particles is preferably from 3 to 20 μm. When the average particle size of the secondary particles is at least 3 μm, decrease in luminescence intensity can be avoided; when the average particle size is at most 20 μm, the particles are readily uniformly dispersed in a resin for sealing the LED, and variation can be suppressed in luminescence intensity and in color tone; such particles are suitable for practical use.

The α-sialon agglomerate obtained by the above production method has a relatively high pulverizability and can be easily pulverized to predetermined particle sizes by a mortar or the like, but it is a matter of course that pulverizing means permitted for use herein include general pulverizing apparatus such as a ball mill, a vibration mill and a jet mill.

Now, (4) will be described in detail.

The α-sialon in this example is represented by the formula: $(Ca,Eu)_{m/2}(Si)_{12-(m+n)}(Al)_{m+n}(O)_n(N)_{16-n}$, and in order to obtain the α-sialon in a single phase and developing the fluorescence property, the formula preferably satisfies the ranges of $0.6 \leq m \leq 3.0$ and $0 \leq n \leq 1.5$; the luminescence property described below is ensured in the ranges. Specifically, the α-sialon of this example is a phosphor represented by the formula: $(Ca,Eu)_{m/2}(Si)_{12-(m+n)}(Al)_{m+n}(O)_n(N)_{16-n}$ and an Eu content is from 0.1 to 0.35 at %, lattice constant a is from 0.780 to 0.790 nm and lattice constant c is from 0.560 to 0.580 nm. Preferably, the Eu content is from 0.1 to 0.25 at %, lattice constant a is from 0.780 to 0.789 nm and lattice constant c is from 0.563 to 0.577 nm.

The α-sialon represented by the above formula might not show a sufficient luminescence property. However, a phosphor excellent, particularly, in the luminescence property can be obtained when the Eu content in the α-sialon is from 0.1 to 0.35 at %, the lattice constant a is from 0.780 to 0.790 nm and the lattice constant c is from 0.560 to 0.580 nm.

The α-sialon of this example with the lattice constant a of from 0.784 to 0.787 nm and the lattice constant c of from 0.569 to 0.572 nm can be obtained by strictly defining its composition as described below in Examples. Namely, raw materials are blended so as to satisfy the Eu content of from 0.1 to 0.35 at %, and then fired while controlling an atmosphere for the firing, to synthesize the α-sialon. Furthermore, when the conditions of $0.6 \leq m \leq 3.0$ and $0 \leq n \leq 1.5$ are satisfied, the α-sialon with the lattice constants in the above specific ranges can be readily obtained.

The α-sialon is generally obtained by heating a powder mixture comprising silicon nitride, aluminum nitride and a compound of an element penetrating to make a solid solution, at a high temperature in an nitrogen atmosphere to cause reaction, as described above. In the course of raising the temperature, substances migrate through a liquid phase composed of silicon nitride, aluminum nitride, oxides on their surfaces and the compound of the element for the solid solution, to form an α-sialon. Therefore, in the α-sialon after the synthesis, some primary particles are sintered to form secondary particles, and they further form agglomerates; therefore, they are subjected to pulverization or the like to obtain the α-sialon in the form of powder suitable for the phosphor.

The α-sialon of this example, after the synthesis, undergoes similar sintering of plural primary particles to produce secondary particles and agglomerates, and thus they are subjected to crushing, pulverizing, etc. to obtain a powdery phosphor of the α-sialon.

The powdery phosphor of the α-sialon obtained by pulverizing and/or crushing as described above shows a higher luminescence property when the average particle size of the particles constituting the α-sialon powder is from 1 to 20 μm. The reason is as follows. When the average particle size of the particles is within the above range, the following problems can be avoided: too fine particles scatter light to decrease the optical absorptance; too coarse particles cause variation in the luminescence intensity and in color tone.

Moreover, the synthesized or pulverized α-sialon powder is susceptible to incorporation of various impurities in the course of the production process. Based on the result of the present inventors' studies, the α-sialon powder is practically applicable without decrease in luminescence intensity when an amount of the impurities other than the constituent elements is at most 1 mass % in the α-sialon powder.

It is noted that the description is omitted herein for a mixing method and mixing apparatus of raw materials for keeping the amount of the above impurities low, a method and conditions for heating the raw-material powders at a high temperature in a nitrogen atmosphere to cause reaction thereof, a pulverization method after the synthesis, and so on because they are substantially the same as those in the production method for the above-mentioned phosphor of (3).

The phosphor of the present invention (α-sialon) has a wide excitation range of from ultraviolet to visible light and emits visible light, and it is thus suitable for light emitting devices and illumination instruments. Particularly, the phosphor resulting from selection of Ca and Eu as the elements penetrating into the crystal lattice of the α-sialon has a high-intensity luminescence property of yellow to orange light with a peak wavelength in the range of from 550 to 600 nm.

Accordingly, the α-sialon of the present invention is used as a phosphor for a light emitting device comprising an luminescent light source and the phosphor as constituent elements or as a phosphor for an illumination instrument comprising the light emitting device; particularly, when the excitation source is visible light containing wavelengths of 440 to 480 nm, the phosphor shows the luminescence property with a peak in the wavelength range of from 550 to 600 nm, and thus has a feature of readily providing white light in combination with a blue LED. In addition, the α-sialon is not deteriorated even under exposure to high temperatures and it is also excellent in heat resistance and in long-term stability under an oxidation atmosphere and a humid environment, whereby the illumination instrument, reflecting these, has features of high luminance and a long life.

The illumination instrument of the present invention comprises at least one luminescent light source and the phosphor of the present invention. Examples of the illumination instrument of the present invention include an LED, a fluorescent lamp, and so on, and an LED can be produced with the phosphor of the present invention by one of the known methods, for example, as described in JP-A-5-152609, JP-A-7-99345, Japanese Patent No. 2927279, and so on. In this case, it is preferable to use as the luminescent light source an ultraviolet LED or blue LED emitting light of the wavelengths of from 350 to 500 nm, and it is particularly preferred to use a blue LED emitting light of wavelengths of from 440 to 480 nm. Examples of these light emitting devices include those made of nitride semiconductors such as GaN and InGaN, and they can be used as the light emitting source emitting light of the predetermined wavelengths, based on adjustment of the composition.

In addition to the method of singly using the phosphor of the present in the illumination instrument as described above, it can also be used in combination with another phosphor having a different luminescence property, so as to constitute an illumination instrument emitting light of a desired color. In particular, in a case where a blue LED is used as the excitation source, when the phosphor of the present invention is combined with another phosphor emitting from green to yellow light with a peak wavelength in the range of from 500 to 550 nm, it achieves emission of white light with a wide color temperature range. Such a phosphor may be a β-sialon in which Eu makes a solid solution. Furthermore, when the phosphor is combined with a red phosphor such as $CaSiAlN_3$:Eu, it achieves an improvement in the color rendering property.

Figure 2:
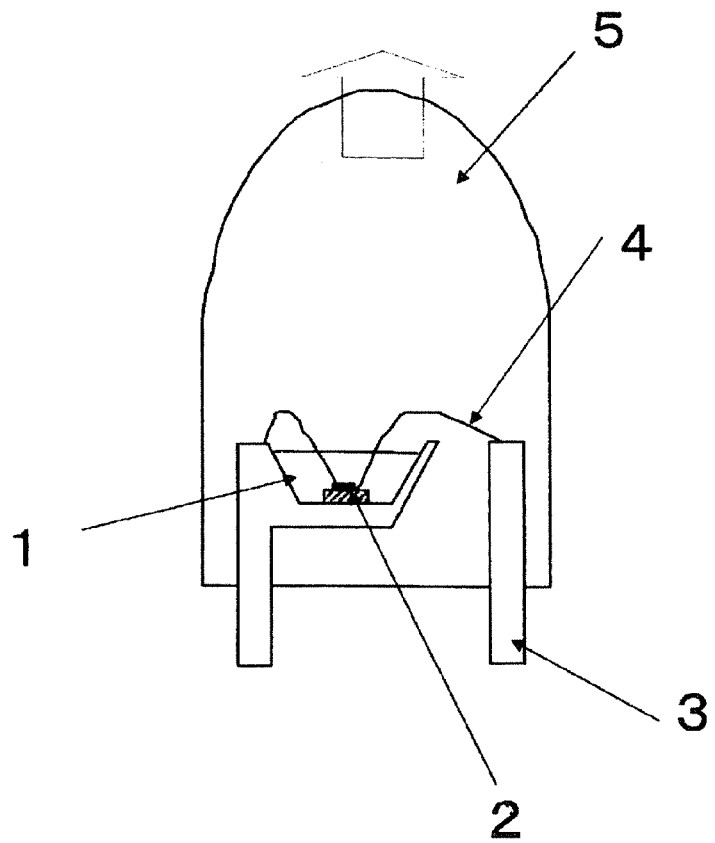
FIG. 2 is a cross-sectional view of a shell-type LED as an example of the light emitting device of the present invention.

FIG. 2 is a cross-sectional view of a shell-type LED as an example of the light emitting device of the present invention. In FIG. 2, reference numeral 1 designates a resin material containing a phosphor, 2 a semiconductor device part, 3 a lead frame, 4 a wire, and 5 a shell-type transparent resin. The phosphor of the present invention is combined with the semiconductor device part 2 in a mixed state in the phosphor-containing resin material 1 to constitute a white LED.

Figure 3:
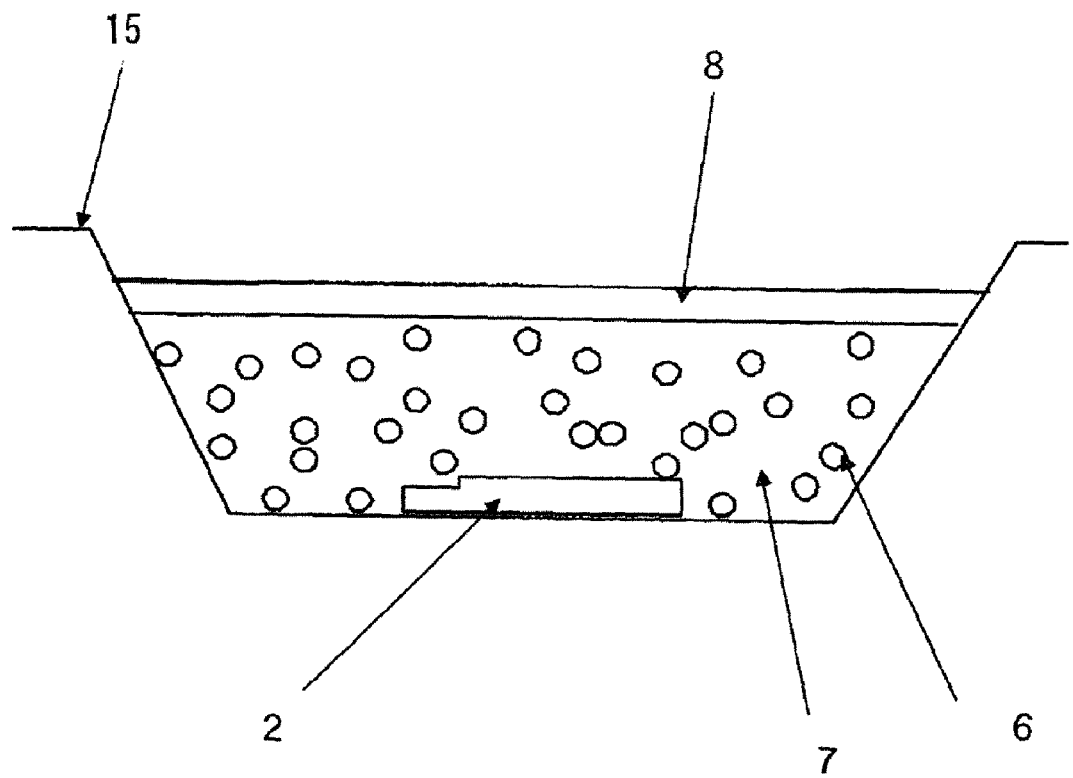
FIG. 3 is a cross-sectional view of another example of the light emitting device of the present invention.

FIG. 3 is a cross-sectional view of another example of the light emitting device of the present invention. This light emitting device has such a configuration that a semiconductor device part 2 placed on the bottom of a container 15 is covered with a resin layer 7 in which the phosphor 6 of the present invention is implanted, and that the upper surface of the resin layer 7 is sealed with a sealant resin 8.

EXAMPLES

Now the present invention will be described further in detail based on Examples and Comparative Examples.

Example 1

Example 1-1

An α-sialon of this example had a composition of raw-material powders composed of 83.0 parts by mass of a silicon nitride powder (manufactured by Denki Kagaku Kogyo Kabushiki Kaisha, 9FW grade), 10.5 parts by mass of an aluminum nitride powder (manufactured by Tokuyama Corporation, F grade), 1.5 parts by mass of a europium oxide powder (manufactured by Shin-Etsu Chemical Co., Ltd., RU grade) and 5.5 parts by mass of a calcium sulfide powder (manufactured by Wako Pure Chemical Industries, Ltd.).

Then the above raw-material powders were mixed by a wet ball mill with a silicon nitride pot and balls in an ethanol solvent for three hours, and filtered and dried to obtain a powder mixture. An amount of oxygen in the powder mixture was measured by an oxygen analyzer manufactured by LECO Corporation and it was 1.2 mass %. 100 g of the powder mixture was filled in a boron nitride crucible with an inner diameter of 100 mm and a height of 60 mm, and subjected to a heat treatment in an electric furnace with a carbon heater in a nitrogen atmosphere at the atmospheric pressure and at 1750° C. for 12 hours. The product thus obtained was crushed in an agate mortar and passed through a 45 µm-mesh sieve. A synthetic powder of an α-sialon phosphor was obtained by these operations.

A composition of the α-sialon powder, which was calculated based on analysis values of metal components of the obtained powder, was $Ca_{0.48}Eu_{0.05}Si_{10.4}Al_{1.6}O_{0.5}N_{15.5}$, wherein X+Y=0.53 and Y/(X+Y)=0.09. An amount of oxygen calculated based on the composition was 1.36 mass %. An amount of oxygen in the α-sialon phosphor obtained was measured with the oxygen analyzer manufactured by LECO Corporation and it was 1.40 mass %. Furthermore, a fluorescence property was measured by means of a spectrophotofluorometer manufactured by Hitachi, Ltd. and a peak wavelength of a luminescence spectrum measured with an excitation wavelength of 400 nm was 580 nm.

Comparisons of the luminescence property with other Examples and Comparative Examples were made as follows: the luminescence intensity at the peak wavelength in the present Example was defined as 100, and a luminescence intensity at a peak wavelength of a luminescence spectrum measured with an excitation wavelength of 400 nm was compared relative to it, for each of the other Examples and Comparative Examples.

Example 1-2

An α-sialon phosphor was produced in the same manner as in Example 1-1 except that 2.8 parts by mass of a calcium sulfide powder and 3.8 parts by mass of a calcium carbonate (hereinafter also referred to simply as "$CaCO_3$") powder (manufactured by KANTO CHEMICAL CO., INC., a guaranteed reagent) were used instead of 5.5 parts by mass of a calcium sulfide (hereinafter also referred to simply as "CaS") in the raw-material powders of Example 1-1. In this case, the molar ratio of $CaS/CaCO_3$ was 1. An amount of oxygen in the powder mixture of the raw-materials was 3.4 mass %.

A composition of the α-sialon thus obtained was $Ca_{0.48}Eu_{0.05}Si_{10.4}Al_{1.6}O_{0.5}N_{15.5}$, wherein X+Y=0.53 and Y/(X+Y)=0.09. An amount of oxygen calculated based on the compositional formula was 1.36 mass%. An amount of oxygen in the α-sialon phosphor obtained was measured with the oxygen analyzer manufactured by LECO Corporation and it was 1.71 mass%. Furthermore, a fluorescence property was measured in the same manner as in Example 1-1 and a relative value of the luminescence intensity was 85, where that in Example 1-1 was defined as 100.

Comparative Example 1-1

An α-sialon phosphor was produced in the same manner as in Example 1-1 except that 7.6 parts by mass of a calcium carbonate powder (manufactured by KANTO CHEMICAL CO., INC., a guaranteed reagent) were used instead of 5.5 parts by mass of a calcium sulfide powder in the raw-material powders of Example 1-1. An amount of oxygen in the powder mixture of the raw materials was 5.6 mass %.

A composition of the α-sialon thus obtained was $Ca_{0.48}Eu_{0.05}Si_{10.4}Al_{1.6}O_{0.5}N_{15.5}$, wherein X+Y=0.53 and Y/(X+Y)=0.09. An amount of oxygen calculated based on the composition was 1.36 mass %. An amount of oxygen in the α-sialon phosphor obtained was measured with the oxygen analyzer manufactured by LECO Corporation and it was 1.80 mass %. Furthermore, a relative value of the luminescence intensity was 65.

Example 1-3

The α-sialon phosphor obtained in Example 1-2 was dispersed in a solution mixture of 48% hydrofluoric acid:60% nitric acid:distilled water=40:10:50 (vol %), maintained at 50° C. for 2 hours, washed and filtered with distilled water, further dispersed in a solution mixture of concentrated sulfuric acid:distilled water=50:50 (vol %), maintained at 90° C. for 2 hours, washed and filtered with distilled water, and dried. An amount of oxygen in the powder obtained was 1.55 mass %. A relative value of the luminescence intensity was 90.

Comparative Example 1-2 and Example 1-4

A composition of raw-material powders was composed of 33.5 parts by mass of a silicon nitride powder (manufactured by Denki Kagaku Kogyo Kabushiki Kaisha, 9FW grade), 29.5 parts by mass of an aluminum nitride powder (manufactured by Tokuyama Corporation, F grade), 2.5 parts by mass of a europium oxide powder (manufactured by Shin-Etsu Chemical Co., Ltd., RU grade) and 35.0 parts by mass of calcium nitride (manufactured by Wako Pure Chemical Industries, Ltd.).

Then, the above raw-material powders were mixed by a wet ball mill with a silicon nitride pot and balls in an xylene solvent for three hours, and filtered and dried to obtain a powder mixture. 100 g of the powder mixture was filled in a boron nitride crucible with an inner diameter of 100 mm and a height of 60 mm, and subjected to a heat treatment in an electric furnace with a carbon heater in a nitrogen atmosphere at a pressure of 0.9 MPa at 1800° C. for 12 hours. The product thus obtained was crushed in an agate mortar and passed through a 45 μm-mesh sieve, whereby a $CaAlSiN_3$:Eu phosphor powder was obtained.

A peak wavelength of a luminescence spectrum measured with an excitation wavelength of 400 nm was 650 nm. The luminescence intensity at the peak wavelength in the present example (Comparative Example 1-2) was defined as 100, and a luminescence intensity at a peak wavelength of a luminescence spectrum measured with an excitation wavelength of 400 nm was compared relative to it, for each of the other Examples and Comparative Examples.

5.0 g of a $CaAlSiN_3$:Eu phosphor powder thus obtained was dispersed well in 50 ml of isopropanol having 0.5 g of magnesium ethoxide (chemical formula: $Mg(OC_2H_5)_2$) dissolved. 50 ml of 15% aqueous ammonia was dropwise added while sufficiently stirring the dispersion solution. A slurry thus obtained was filtered and washed, and dried, followed by firing at 1100° C. in a nitrogen atmosphere for one hour to obtain a phosphor with a magnesia coating film.

The phosphor thus obtained was observed with a transmission electron microscope, and the thickness of the magnesia film was found to be about 60 nm. A fluorescent spectrum was measured and the luminescence spectral intensity was 115 (Example 1-4).

A magnesia film obtained in the same manner as above was subjected to measurement of a refractive index by means of a reflective film thickness monitor manufactured by OTSUKA ELECTRONICS CO., LTD. and the refractive index was 1.73.

Comparative Example 1-3

A phosphor with a magnesia coating film was obtained in the same manner as in Example 1-4 except that the amount of magnesium ethoxide was changed to 1.0 g. The phosphor thus obtained was observed by means of a transmission electron microscope, and the thickness of the magnesia film was about 110 nm. A fluorescent spectrum was measured and the luminescence spectral intensity was 96, where that in Comparative Example 1-2 was defined as 100.

Example 1-5

This example is an example of forming an alumina film as the transparent film on the surface of the α-sialon phosphor. 32 ml of 0.1 M sodium hydroxide was added to 50 ml of an aqueous solution of 0.1 M boric acid and 0.1 M calcium chloride, and diluted up to 100 ml with distilled water. 5.0 g of the α-sialon phosphor powder obtained in the same manner as in Example 1-1 was put into this aqueous solution and dispersed well.

10 ml of an aqueous solution of 0.1 M aluminum sulfate was dropwise added while maintaining the pH of the above slurry in a range of from 9.0 to 10.5 with an aqueous solution of sodium hydroxide, to obtain phosphor particles in which fine particles of aluminum hydroxide adhered to surfaces of the slurry particles. The phosphor particles were washed, dried and calcined at 600° C. in air for two hours, thereby obtaining a phosphor powder with an alumina film formed on the surface. The phosphor particles were observed by means of a transmission electron microscope, and the thickness of the alumina film was found to be 50 nm. A fluorescent spectrum was measured with the spectrophotofluorometer and a relative value of the luminescence intensity was 108 where that in Example 1-1 was defined as 100.

An alumina film obtained in the same manner as above was subjected to the measurement of the refractive index in the same manner as in Example 1-4, and it was 1.70.

Example 1-6

The present Example is an example of forming a silica film on the surface of the α-sialon phosphor. 5.0 g of an oxynitride phosphor powder obtained in the same manner as in Example 1-1 was dispersed well in a solution mixture of 50 ml of isopropanol and 20 ml of distilled water having 1.0 g of tetraethoxysilane dissolved therein. While sufficiently stirring the dispersion liquid, 50 ml of 15% aqueous ammonia was dropwise added and then reflux with heating was carried out under stirring for two hours. The slurry thus obtained was filtered, washed and dried, followed by firing at 600° C. in a nitrogen atmosphere for one hour to obtain a phosphor with an amorphous silica coating film.

The phosphor thus obtained was observed with a transmission electron microscope and the thickness of the silica film was found to be about 70 nm. A fluorescent spectrum was measured and the luminescent spectral intensity was 113, where that in Example 1-1 was defined as 100.

A silica film obtained in the same manner as above was subject to the measuring of the refractive index in the same manner as in Example 1-4, and it was 1.48.

Example 1-7

10 g of an oxynitride phosphor with an alumina coating film obtained in the same manner as in Example 1-5 was added together with 1.0 g of an epoxy-type silane coupling agent (manufactured by Shin-Etsu Silicone, KBE402) to 100 g of water and the mixture was left overnight under stirring. Then 0.5 g of the oxynitride phosphor treated with the silane coupling agent, after filtered and dried, was kneaded with 5.0 g of an epoxy resin (manufactured by SANYU REC CO. LTD, NLD-SL-2101), potted onto a blue LED with a luminescence wavelength of 470 nm, subjected to vacuum deaeration and cured under heating at 110° C. to produce a surface mount LED. An electric current of 10 mA was applied to the surface mount LED, a luminescence spectrum of light emitted therefrom was measured, and the intensity at 580 nm was defined as 100.

Example 1-8

A surface mount LED was prepared in the same manner as in Example 1-7, using an oxynitride phosphor with a silica coating film obtained in the same manner as in Example 1-6, and a luminescence spectrum was measured.

The intensity at 580 nm was 95 where that in Example 1-7 was defined as 100.

Example 1-9

Instead of the epoxy resin described in Example 1-7, an epoxy resin (refractive index: 1.6) using a fluorene-type epoxy compound was subjected to potting and cured, and a fluorine-type coating agent (manufactured by Tokyo Sangyo Yoshi Co., Ltd., INT350, refractive index: 1.36) was applied to the surface to form a fluorine resin layer of about 1 μm. The intensity at 580 nm in the luminescence spectrum of this light emitting device was 108 where that in Example 1-7 was defined as 100.

Example 1-10

10 g of a nitride phosphor obtained in the same manner as in Example 1-4, together with 1.0 g of an epoxy-based silane coupling agent, was added to 100 ml of distilled water and left overnight under stirring. Thereafter, it was filtered and dried and then subjected to the measurement of the luminescence spectrum. The luminescence intensity at 650 nm was 104, where that in Example 1-4 was defined as 100.

Comparative Example 1-4

A surface mount LED was produced in the same manner as in Example 1-7, using an oxynitride phosphor obtained in the same manner as in Example 1-1, without an alumina coating film. The luminescence spectral intensity of the LED at 580 nm was 75, where that in Example 1-7 was defined as 100.

Comparative Example 1-5

An oxynitride phosphor was prepared in the same manner as in Example 1-1 except that the composition of the raw-material powders was changed to 51.0 parts by mass of silicon nitride power, 30.0 parts by mass of aluminum nitride power, 3.1 parts by mass of europium oxide power (Shin-Etsu Chemical Co., Ltd., RU grade) and 17.0 parts by mass of calcium sulfide power. The powder thus obtained was analyzed by means of an X-ray diffractometer and many peaks not assigned to the α-sialon were detected. The composition of the phosphor was $Ca_{1.54}Eu_{0.10}Si_{7.2}Al_{4.8}O_{1.5}N_{14.5}$ calculated as the α-sialon based on analysis values of metal components, and the composition X+Y=1.64. A relative value of the luminescence intensity at 580 nm was 50, where that in Example 1-1 was defined as 100.

Example 1-11

90.1 parts by mass of a silicon nitride powder (manufactured by Denki Kagaku Kogyo Kabushiki Kaisha, 9FW grade), 9.0 parts by mass of an aluminum nitride powder (manufactured by Tokuyama Corporation, F grade), and 0.9 parts by mass of a europium oxide powder (manufactured by Shin-Etsu Chemical Co., Ltd., RU grade) were mixed in an ethanol solvent with a silicon nitride pot and balls for two hours, filtered and dried to obtain a powder mixture. 100 g of the powder mixture was filled in a boron nitride crucible with an inner diameter of 100 mm and a height of 60 mm and subjected to a heat treatment in an electronic furnace with a carbon heater in a nitrogen atmosphere at 0.9 MPa, and at 1900° C. for 12 hours, and a resultant product was crushed by means of an agate mortar and passed through a 45 μm-mesh sieve. A synthetic powder of a β-sialon phosphor was obtained by these operations. The fluorescence property was measured by means of a spectrophotofluorometer manufactured by Hitachi, Ltd. and the peak wavelength of the fluorescent spectrum was 540 nm when measured with an excitation wavelength of 400 nm.

The powder was treated in the same manner as in Example 1-5, to form an aluminum oxide coating film on the surface and the fluorescence property was measured. A luminescence intensity of the phosphor powder with the coating film was 110, where that of the β-sialon phosphor powder without the coating film at 540 nm was defined as 100.

Example 2

Example 2-1

The raw-material powders used were an α-silicon nitride powder (NP200 grade) manufactured by Denki Kagaku Kogyo Kabushiki Kaisha, an aluminum nitride powder (F grade) manufactured by Tokuyama Corporation, a calcium carbonate powder (guaranteed reagent) manufactured by KANTO CHEMICAL CO., INC., a calcium fluoride powder (guaranteed reagent) manufactured by Wako Pure Chemical Industries, Ltd. and a europium oxide powder (RU grade) manufactured by Shin-Etsu Chemical Co., Ltd., and they were blended in the composition as shown in Table 1 so as to obtain an α-sialon in a single phase after the synthesis.

TABLE 1

|  | Composition of mixture (mass %) | | | | | | Synthetic conditions | |
|---|---|---|---|---|---|---|---|---|
|  | $Si_3N_4$ | AlN | $CaCO_3$ | $CaF_2$ | $Eu_2O_3$ | $B_2O_3$ | Temp (° C.) | Retention time (hr) |
| Example 1 | 81.65 | 10.22 | 3.74 | 2.92 | 1.45 | — | 1700 | 16 |
| Example 2 | 73.75 | 14.92 | 5.77 | 4.50 | 1.07 | — | 1700 | 6 |
| Example 3 | 81.35 | 10.19 | 3.52 | 2.75 | 2.19 | — | 1700 | 16 |
| Comparative Example 1 | 80.98 | 10.14 | 7.43 | — | 1.45 | — | 1700 | 16 |
| Comparative Example 2 | 81.65 | 10.22 | 3.74 | 2.92 | 1.45 | 1.00 | 1700 | 16 |
| Comparative Example 3 | 81.65 | 10.22 | 3.74 | 2.92 | 1.45 | — | 1550 | 16 |

The raw-material powders blended were mixed in an isopropyl alcohol solvent by a wet ball mill with a plastic pot and silicon nitride balls, and the solvent was removed by a rotary evaporator to obtain a powder mixture.

About 50 g of the above powder mixture was so filled in a sufficiently dense boron nitride crucible with an inner diameter of 80 mm and a height of 50 mm (manufactured by Denki Kagaku Kogyo Kabushiki Kaisha, N-1 grade) that the bulk density became about 0.3 g/cm³. A lid made of the same material as the crucible was put on the crucible and a heat treatment was carried out in an electric furnace with a carbon heater in a nitrogen atmosphere of the atmospheric pressure. Table 1 shows the highest temperature and a retention time in the heating. A sample thus obtained was crushed with an agate mortar until it passed through a 75 μm-mesh sieve.

The powder thus obtained by the above operation was subjected to identification of crystal phases by the X-ray diffraction (XRD) method, quantification of crystal phases by the Rietveld analysis, and measurement of a particle size distribution of secondary particles by the laser diffraction scattering method. Furthermore, the powder was observed with a scanning electron microscope (SEM), and circle-equivalent diameters and aspect ratios (long-axis diameter/short-axis diameter) of primary particles were measured from an observation image thus obtained, thereby calculating a distribution of circle-equivalent diameters (a ratio of the number of primary particles with the circle-equivalent diameters of from 3 to 10 μm to the total number of the primary particles) and an average aspect ratio. The evaluation was carried out with respect to at least 500 primary particles.

A fluorescent spectrum was measured with blue light excitation (wavelength of 460 nm) by means of a spectrophotofluorometer and a peak intensity and a peak wavelength of the spectrum were determined from the spectrum. It is noted that the peak intensity changes depending on measuring apparatus and conditions, and the unit is an arbitrary unit. Examples and Comparative Examples were compared with values measured under the same condition.

An amount of boron in the synthetic powder was measured by the ICP emission spectrometry and an amount of fluorine was measured by the following method. 0.5 g of a sample was introduced into a reaction tube at 1200° C., and subjected to hydrolysis with water vapor at 95 to 96° C., and the generated gas was absorbed in 10 ml of 0.05 mass % NaOH solution, followed by measurement by ion chromatography. Table 2 shows the results of the above-described evaluations.

TABLE 2

|  | B content (ppm) | F content (ppm) | Average particle size of secondary particles (μm) | Primary particles (SEM) | | Luminescence property (in excitation at 460 nm) | |
|---|---|---|---|---|---|---|---|
|  |  |  |  | Rate of 3-10 μm particles (%) | Average aspect ratio | Peak intensity (arbitrary unit) | Peak wavelength (nm) |
| Example 1 | 590 | 40 | 10 | 92 | 1.5 | 685 | 587 |
| Example 2 | 460 | 250 | 8.8 | 87 | 1.4 | 620 | 584 |
| Example 3 | 620 | 30 | 12 | 90 | 1.5 | 590 | 589 |
| Comparative Example 1 | 580 | N.D. | 14 | 40 | 1.3 | 360 | 590 |
| Comparative Example 2 | 4520 | 35 | 11 | 90 | 1.5 | 480 | 588 |
| Comparative Example 3 | 380 | 1200 | 7.5 | 20 | 1.1 | 430 | 582 |

It was found from the result of the XRD measurement that the synthetic powder was a single phase of the synthetic α-sialon and that the average particle size (secondary particles) was 10 μm. It was found from the result of the SEM observation that the particle form was such that plural relatively equiaxial micron-size primary particles were sintered together. The ratio of primary particles with circle-equivalent diameters from 3 to 10 μm was 92% and the average aspect ratio was 1.5. A boron content was 590 ppm and a fluorine content was 40 ppm. When excited with blue light of the wavelength of 460 nm, the phosphor emitted yellow-orange light with the peak wavelength of 587 nm.

Examples 2-2 to 2-3

Examples 2-2 and 2-3 were prepared and evaluated in the same manner and procedure as in Example 2-1. Table 1 shows the compositions of raw-material powders and synthetic conditions, and Table 2 shows the evaluation results of the synthetic products.

Comparative Examples 2-1 to 2-3

Comparative Examples 2-1 to 2-3 were prepared and evaluated in the same manner and procedure as in Example 2-1. It was, however, noted that in Comparative Example 2-2, a boron oxide powder manufactured by Wako Pure Chemical Industries, Ltd. was added by a content of 1 mass % as a part per hundred raw-material mixture, in addition to the raw-material powders in Example 2-1.

In Comparative Example 2-1, sizes of primary particles constituting the synthetic powder were as large as the order of from sub μm to a few μm and the ratio of primary particles with a circle-equivalent diameters from 3 to 10 μm was 40%. The peak wavelength of the luminescence spectrum was 590 nm, which was close to that in Example 2-1, but the luminescence intensity was approximately half. In Comparative Example 2-2, a boron content was 4520 ppm and the peak wavelength of the luminescence spectrum was 588 nm, but the luminescence intensity was about 70% of that in Example 2-1. In Comparative Example 2-3, a fluorine content was 1200 ppm and it was confirmed by X-ray diffraction that in addition to the α-sialon, non-reacted silicon nitride, aluminum nitride and europium oxyfluoride existed. It was found from the result of SEM observation that the primary particles were composed of a small number of micron-size particles and a large number of submicron-size particles and that the ratio of the primary particles with a circle-equivalent diameters of from 3 to 10 μm was as low as 20%. The luminescence intensity was about 60% of that in Example 2-1.

Example 2-4

10 g of an α-sialon phosphor obtained in Example 2-1 was added together with 1.0 g of an epoxy-type silane coupling agent (manufactured by Shin-Etsu Silicone, KBE402) to 100 g of water and the mixture was left overnight under stirring. Then an appropriate amount of the α-sialon phosphor treated with the silane coupling agent, after filtered and dried, was kneaded with 10 g of an epoxy resin (manufactured by SANYU REC CO. LTD, NLD-SL-2101), potted onto a blue LED with a luminescence wavelength of 460 nm, subjected to vacuum deaeration and cured under heating at 110° C. to produce a surface mount LED.

Figure 4:
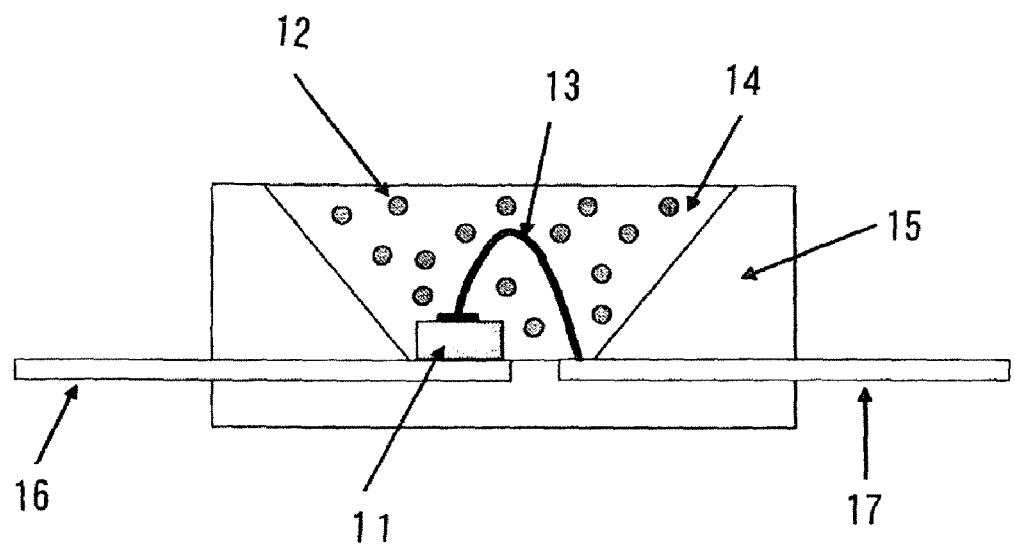
FIG. 4 is a schematic view of an illumination instrument (surface mount LED) according to Example 2-4 of the present invention.

FIG. 4 shows a schematic structure of a white LED (the above-mentioned surface mount LED). Namely, as shown in FIG. 4, the white LED is fabricated as follows: a blue LED chip 11 is connected to an electrically conductive terminal 16 and placed on the bottom of a container 15; the blue LED chip 11 is connected to another electrically conductive terminal 17 with a wire 3; then a mixture obtained by kneading an α-sialon phosphor 12 and a sealant resin (epoxy resin) 14 is potted onto the blue LED chip 11; and the sealant resin 14 is subjected to curing under heating. A luminescence spectrum of emitted light was measured while an electric current of 10 mA was applied to the surface mount LED. Table 3 shows the luminescence property and average color rendering index. An illumination instrument with a high luminance and a low correlated color temperature (incandescent color) was obtained.

Example 2-5

A surface mount LED was fabricated in the same manner as in Example 2-4, by mixing appropriate amounts of two kinds of the phosphor in Example 2-1 and a β-sialon doped with Eu showing yellow-green luminescence with the peak wavelength of 535 nm under excitation at the wavelength of 460 nm. Table 3 shows the luminescence property and average color rendering index. An illumination instrument obtained had a daylight color and a color rendering property higher than that in Example 2-4.

TABLE 3

| Lamp | Lamp efficiency (lm/W) | Chromaticity coordinate (CIE1931) | | Correlated color temperature (K) | Average color rendering index Ra |
|---|---|---|---|---|---|
| | | Color tone x | Color tone y | | |
| Example 4 | 40.0 | 0.454 | 0.408 | 2860 | 68.5 |
| Example 5 | 28.5 | 0.313 | 0.322 | 6450 | 85.0 |

Example 3

Example 3-1

The raw-material powders used were an α-silicon nitride powder (9FW grade) manufactured by Denki Kagaku Kogyo Kabushiki Kaisha, an aluminum nitride powder (F grade) manufactured by Tokuyama Corporation, a calcium carbonate powder (guaranteed reagent) manufactured by KANTO CHEMICAL CO., INC., a calcium fluoride powder (guaranteed reagent) manufactured by Wako Pure Chemical Industries, Ltd. and a europium oxide powder (RU grade) manufactured by Shin-Etsu Chemical Co., Ltd., and they were blended so as to obtain an α-sialon in a single phase after the synthesis (cf. Table 4)

TABLE 4

| | Composition of mixture (mass %) | | | | |
|---|---|---|---|---|---|
| | $Si_3N_4$ | AlN | $CaCO_3$ | $CaF_2$ | $Eu_2O_3$ |
| Example 3-1 | 81.65 | 10.22 | 3.74 | 2.92 | 1.46 |
| Example 3-2 | 77.61 | 12.60 | 4.74 | 3.70 | 1.35 |
| Example 3-3 | 73.75 | 14.92 | 5.77 | 4.50 | 1.07 |
| Example 3-4 | 69.88 | 17.15 | 6.67 | 5.20 | 1.10 |
| Example 3-5 | 66.15 | 19.33 | 7.57 | 5.90 | 1.05 |
| Comparative Example 3-1 | 85.12 | 8.29 | 3.04 | 2.37 | 1.19 |
| Comparative Example 3-2 | 62.50 | 21.44 | 8.42 | 6.57 | 1.07 |
| Comparative Example 3-3 | 66.00 | 16.94 | 5.86 | 4.57 | 3.64 |

The above raw-material powders were mixed in a solvent of ethanol by a wet ball mill with a silicon nitride pot and balls for three hours, and the solvent was filtered by means of a rotary evaporator or the like and dried to obtain a powder mixture.

100 g of the powder mixture was filled in a boron nitride crucible with an inner diameter of 100 mm and a height of 85 mm and a heat treatment was carried out in an electric furnace with a carbon heater in a nitrogen atmosphere of the atmospheric pressure and at 1700° C. for 12 hours. The product thus obtained was crushed with an agate mortar and passed through a 45 μm-mesh sieve. A synthetic powder was obtained by these operations.

It was found that the result of the XRD measurement (MXP3 manufactured by Mac Science was used as the measurement apparatus) that the synthetic powder was a single phase of the α-sialon.

A fluorescent spectrum was measured with blue light excitation (wavelength of 460 nm) by means of a spectrophotofluorometer (F4500) manufactured by Hitachi High-Technologies Corporation and a peak intensity and a peak wavelength of the spectrum were determined from the spectrum. It is noted that the peak intensity changes depending on measuring apparatus and conditions, and the unit is an arbitrary unit. Examples and Comparative Examples were compared with values measured under the same condition. Table 5 shows the results of the above-described evaluations.

TABLE 5

| | Eu content (at %) | Luminescence property (in excitation at 460 nm) | | Lattice constants (nm) | | Average particle size of secondary particles (nm) | Total content of impurities (Fe, Co, Ni) (ppm) |
| | | Peak intensity (arbitrary unit) | Peak wavelength | a | c | | |
|---|---|---|---|---|---|---|---|
| Example 3-1 | 0.175 | 570 | 587 | 0.781 | 0.567 | 11.8 | 300 |
| Example 3-2 | 0.164 | 595 | 590 | 0.782 | 0.568 | 12 | 350 |
| Example 3-3 | 0.132 | 615 | 591 | 0.784 | 0.570 | 13 | 330 |
| Example 3-4 | 0.135 | 625 | 590 | 0.786 | 0.571 | 16 | 300 |
| Example 3-5 | 0.134 | 617 | 588 | 0.787 | 0.572 | 17 | 500 |
| Comparative Example 3-1 | 0.141 | 390 | 581 | 0.780 | 0.566 | 10.5 | 350 |
| Comparative Example 3-2 | 0.134 | 150 | 587 | 0.788 | 0.572 | 18 | 13000 |
| Comparative Example 3-3 | 0.450 | 485 | 595 | 0.786 | 0.571 | 15 | 500 |

An Eu content was obtained by composition analysis by means of a fluorescent X-ray analyzer (ZSX100e) manufactured by Rigaku Industrial Corporation and an O/N analyzer (TC-436) manufactured by LECO Corporation. The content was found to be 0.175 at %.

Particles were subjected to measurement of a particle size distribution by the laser diffraction scattering method (using a measuring apparatus LS230 manufactured by Coulter Company). The average particle size (secondary particles) was 11.8 μm.

Analysis of impurities in the synthetic powder was conducted by the ICP emission spectrometry, and a total amount of Fe, Co and Ni was found to be 300 ppm.

There are no particular limitations on the measurement method of measuring the lattice constants by the XRD diffraction. For example, there is a method of mixing and pulverizing a sample with an internal standard substance and measuring the lattice constants with an X-ray diffraction apparatus. Aluminum oxide, magnesium oxide, silicon, and so on are generally used as the internal standard substance. However, it is preferred to use a substance whose peak does not overlap the peak of the sample. After the X-ray diffraction measurement, refinement of the lattice constants is conducted with use of analysis software of the lattice constants. An example of the analysis software is JADE manufactured by Rigaku Corporation.

As the result of the lattice constant measurement by the XRD diffraction, the lattice constant a was 0.781 nm, and the lattice constant c was 0.567 nm. It was noted that the lattice constant measurement was carried out based on JIS K0131.

Examples 3-2 to 3-5

Raw materials were so blended that the value m of the α-sialon obtained became from 1.25 to 2, in the same manner and procedure as in Example 3-1 (cf. Table 4). The raw materials blended were treated in the same manner as in Example 3-1, to obtain various synthetic powders.

Table 5 shows the results for these synthetic powders. With respect to the luminescence property, the peak intensities were high, among which Example 3-4 was highest. With respect to the lattice constant measurement, both the lattice constants a and c had large numeral values.

Comparative Examples 3-1 to 3-3

Raw materials were so blended that the value m became 0.8 in Comparative Example 3-1 and 2.25 in Comparative Example 3-2, and that the value m was 1.75 and the Eu content was at least 0.35 at % in Comparative Example 3-3, in the same manner and procedure as in Example 3-1, and the same treatment as in Example 3-1 was conducted to obtain various synthetic powders.

The synthetic powder obtained in Comparative Example 3-2 was pulverized for one minute by a vibration mill using a stainless-steel pot, then crushed in an agate mortar and passed through a 45 μm-mesh sieve.

These synthetic powders were evaluated and it was found that with the value m of 0.8 (Comparative Example 3-1) the luminescence property was further decreased as compared with Example 3-1 having the value m of 1.0, and that the lattice constant values were also smaller; and that with the value m of 2.25 (Comparative Example 3-2), the luminescence property was decreased as compared with Example 3-5 having the value m of 2 but the lattice constant values became maximum.

Furthermore, in Comparative Example 3-3, the luminescence property was decreased but the lattice constant values were equal to those in Example 3-4.

INDUSTRIAL APPLICABILITY

Since the phosphor of the present invention has a wide excitation range from ultraviolet to visible light and emits visible light, it is suitable for a light emitting device, particularly, for a white LED, and, when used in combination with an excitation light source of ultraviolet or visible light with the maximum intensity of luminescence wavelengths in the range of from 100 to 500 nm, preferably from 240 to 480 nm, it is suitably applicable as a phosphor for a light emitting device or an illumination instrument.

The entire disclosures of Japanese Patent Application No. 2005-052270 filed on Feb. 28, 2005, Japanese Patent Application No. 2005-118271 filed on Apr. 15, 2005, Japanese Patent Application No. 2005-146917 filed on May 19, 2005, and Japanese Patent Application No. 2005-304268 filed on Oct. 19, 2005 including the specifications, claims, drawings and summaries are incorporated herein by reference in their entireties.

The invention claimed is:

1. A powdery phosphor comprising particles of an α-sialon represented by the following formula:

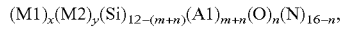

wherein

M1 is at least one element selected from the group consisting of Li, Mg, Ca, Y and lanthanide metals (except for La and Ce), M2 is at least one element selected from the group consisting of Ce, Pr, Eu, Tb, Yb and Er, $0.3 \leq X+Y \leq 1.5$, $0 < Y \leq 0.7$, $0.6 \leq m \leq 3.0$, $0 \leq n \leq 1.5$, $X+Y = m/2$, an actual oxygen content in the powdery phosphor comprising particles of the α-sialon is larger than a theoretical value calculated based on the formula in an amount of less than 0.4 wt. % of said theoretical value, and a transparent material having a refractive index of from 1.2 to 2.5 and a thickness of from 5 nm to 100 nm is coated on at least a part of a surface of the particles of the α-sialon.

2. The powdery phosphor according to claim 1, wherein the formula is $(Ca,Eu)_{m/2}(Si)_{12-(m+n)}(Al)_{m+n}(O)_n(N)_{16-n}$, and the α-sialon has an Eu content of 0.1-0.35 atomic %, a lattice constant a of 0.780-0.790 nm, and a lattice constant c of 0.560-0.580 nm.

3. The powdery phosphor according to claim 1, which comprises particles of a metal nitride or oxynitride, wherein a transparent film is formed on at least a part of a surface of each particle of the metal nitride or oxynitride and in a thickness of (10 to 180)/n (unit: nanometer, n: a refractive index of the transparent film (from 1.2 to 2.5)).

4. The powdery phosphor according to claim 1, which has a transparent film on at least a part of a surface of a powder particle of the sialon, wherein a refractive index of the transparent film is from 1.2 to 2.5, and wherein the transparent film is formed in a thickness of (10 to 180)/n (unit: nanometer, n: the refractive index of the transparent film (from 1.2 to 2.5)).

5. The powdery phosphor according to claim 4, wherein the refractive index n of the transparent film is from 1.5 to 2.0.

6. The powdery phosphor according to claim 1, wherein M1 contains at least Ca, and M2 contains at least Eu.

7. The powdery phosphor according to claim 6, wherein M1 is Ca and M2 is Eu.

8. The powdery phosphor according to claim 1, which comprises fluorine in an amount of from 5 to 300 ppm.

9. The powdery phosphor according to claim 1, which comprises boron in an amount of from 10 to 3000 ppm.

10. The powdery phosphor according to claim 1, wherein M1 contains at least Ca, M2 contains at least Eu, and $0.01 < Y/(X+Y) < 0.3$; and which has a luminescence property with a peak in a wavelength range of from 550 to 600 nm when irradiated with ultraviolet or visible light having a maximum intensity of emission wavelengths in a range of from 100 to 500 nm.

11. The powdery phosphor according to claim 1, wherein an average particle size of powder particles of the α-sialon is from 1 to 20 μm.

12. The powdery phosphor according to claim 1, wherein a content of an impurity other than the elements constituting the formula of the α-sialon is at most 1 mass%.

13. A light emitting device comprising a luminescent light source and a phosphor, wherein the phosphor is at least one as defined in claim 1.

14. The light emitting device according to claim 13, wherein the luminescent light source is an LED having a maximum intensity of emission wavelengths in a range of from 240 to 480 nm.

15. The light emitting device according to claim 14, wherein the LED and the phosphor as defined in claim 1 are implanted in a resin layer with a refractive index of from 1.58 to 1.85, and wherein a surface of the resin layer is covered with a resin with a refractive index of from 1.3 to 1.58.

16. An illumination instrument comprising the light emitting device as defined in claim 13.

17. The illumination instrument according to claim 16, wherein the phosphor used is a phosphor with a luminescence property having a peak in a wavelength range of from 500 to 550 nm when irradiated with ultraviolet or visible light of wavelengths of from 100 to 500 nm as an excitation source.

an actual oxygen content in the powdery phosphor comprising particles of the α-sialon is larger than a theoretical value calculated based on the formula in an amount of less than 0.4 wt. % of said theoretical value, wherein said process comprises:

coating on at least a part of a surface of the particles of the α-sialon a transparent material having a refractive index of from 1.2 to 2.5 and a thickness of from 5 nm to 100 nm.

18. A powdery phosphor comprising particles of an α-sialon represented by the following formula:

wherein $0.3 \leq X+Y \leq 1.5$, $0 < Y \leq 0.7$, primary particles of the powdery phosphor comprising the α-sialon have an average aspect ratio of at most 3, and at least 80% (percentage by particle number) of the primary particles have a diameter of from 3 μm to 10 μm, an actual oxygen content in the powdery phosphor comprising particles of the α-sialon is larger than a theoretical value calculated based on the formula in an amount of less than 0.4 wt. % of said theoretical value, and a transparent material having a refractive index of from 1.2 to 2.5 and a thickness of from 5 nm to 100 nm is coated on at least a part of a surface of the particles of the α-sialon.

19. A process for producing a phosphor comprising particles of an α-sialon represented by the following formula:

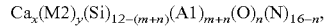

wherein

M2 is at least one element selected from the group consisting of Ce, Pr, Eu, Tb, Yb and Er, $0.3 \leq X+Y \leq 1.5$, $0 < Y \leq 0.7$, $0.6 \leq m \leq 3.0$, $0 \leq n \leq 1.5$, $X+Y = m/2$, a calcium compound containing no oxygen selected from the group consisting of calcium chloride, calcium sulfide, calcium nitride, calcium cyanamide and calcium carbide is used as a raw material for Ca, and 20. The process for producing the phosphor according to claim 19, wherein a calcium compound containing oxygen is used in combination with the calcium compound containing no oxygen, as the raw material for Ca.

21. The process for producing the phosphor according to claim 20, wherein the calcium compound containing no oxygen is used at a molar ratio of at least 0.5 time the calcium compound containing oxygen.

22. The process for producing the phosphor according to claim 19, wherein the total oxygen content in all raw materials is at most 4 mass %.

23. The process for producing the phosphor according to claim 19, further comprising an acid treatment of the phosphor, after production of the phosphor.

24. A process for producing a phosphor, comprising:
suspending in an organic solvent a powdery phosphor comprising particles of an α-sialon represented by the following formula:

$$Ca_x(M2)_y(Si)_{12-(m+n)}(Al)_{m+n}(O)_n(N)_{16-n},$$

wherein
M2 is at least one element selected from the group consisting of Ce, Pr, Eu, Tb, Yb and Er,
$0.3 \leq X+Y \leq 1.5$,
$0 < Y \leq 0.7$,
$0.6 \leq m \leq 3.0$,
$0 < n \leq 1.5$,
$X+Y=m/2$, and
an actual oxygen content in the powdery phosphor comprising particles of the α-sialon is larger than a theoretical value calculated based on the formula in an amount of less than 0.4 wt. % of said theoretical value;
dropwise adding an organic metal complex or a metal alkoxide in the suspension to form a transparent film in a thickness of (10 to 180)/n (unit: nanometer, n: a refractive index of the transparent film (from 1.2 to 2.5)) on at least a part of a surface of each particle of the α-sialon constituting the phosphor; and
coating on at least a part of a surface of the particles of the α-sialon a transparent material having a refractive index of from 1.2 to 2.5 and a thickness of from 5 nm to 100 nm.

25. A process for producing a phosphor, comprising:
suspending in water a powdery phosphor comprising particles of an α-sialon represented by the following formula:

$$Ca_x(M2)_y(Si)_{12-(m+n)}(Al)_{m+n}(O)_n(N)_{16-n},$$

wherein
M2 is at least one element selected from the group consisting of Ce, Pr, Eu, Tb, Yb and Er,
$0.3 \leq X+Y \leq 1.5$,
$0 < Y \leq 0.7$,
$0.6 \leq m \leq 3.0$,
$0 \leq n \leq 1.5$,
$X+Y=m/2$, and
an actual oxygen content in the powdery phosphor comprising particles of the α-sialon is larger than a theoretical value calculated based on the formula in an amount of less than 0.4 wt. % of said theoretical value;
dropwise adding an aqueous solution of a metal salt with a pH being kept constant, to form a transparent film in a thickness of (10 to 180)/n (unit: nanometer, n: a refractive index of the transparent film (from 1.2 to 2.5)) on at least a part of a surface of each particle of the α-sialon constituting the phosphor; and
coating on at least a part of a surface of the particles of the α-sialon a transparent material having a refractive index of from 1.2 to 2.5 and a thickness of from 5 nm to 100 nm.

* * * * *